United States Patent [19]

Kato

[11] Patent Number: 5,034,965

[45] Date of Patent: Jul. 23, 1991

[54] EFFICIENT CODING METHOD AND ITS DECODING METHOD

[75] Inventor: Shiro Kato, Hirakata, Japan

[73] Assignee: Matsushita Electric Industrial Co., Ltd., Osaka, Japan

[21] Appl. No.: 433,341

[22] Filed: Nov. 8, 1989

[30] Foreign Application Priority Data

Nov. 11, 1988 [JP] Japan ............................... 63-286145

[51] Int. Cl.$^5$ ............................................. H04B 14/06
[52] U.S. Cl. ...................................... 375/26; 341/76; 341/94; 375/27; 375/34
[58] Field of Search ....................... 375/25, 26, 27, 34, 375/122; 341/51, 67, 76, 94; 358/13, 138, 430

[56] References Cited

U.S. PATENT DOCUMENTS

| | | | |
|---|---|---|---|
| 4,571,737 | 2/1986 | Nishitani et al. | 341/76 |
| 4,791,485 | 12/1988 | Kuroda et al. | 375/26 |
| 4,792,954 | 12/1988 | Arps et al. | 341/94 |
| 4,933,762 | 6/1990 | Guichard et al. | 375/26 |

OTHER PUBLICATIONS

Mizui, et al., "Variable Bit Rate Modulo-PCM Using Adaptive Prediction", IEEE International Conference on Communications '88, vol. 2/3, pp. 652-656, Jun. 12, 1988.

T. Ericson & V. Ramamoorthy, "Modulo-PCM: A New Source Coding Scheme", In Conf., Int. Conf. Acoust., Speech, Signal Processing, ICASSP '79, Sachington, DC, 1979, pp. 419-422.

V. Ramamoorthy, "Speech Coding Using Modulo-PCM with Side Information", In Conf. Rec., Int. Conf. Acoust., Speech, Signal Processing, ICASSP '81, Atlanta, GA, Mar. 1981, pp. 832-835.

V. Ramamoorthy, "A Novel Speech Coder for Medium and High Bit Rate Application Using Modulo-PCM Principles", IEEE Trans. Acoust., Speech, Signal Processing, vol. ASSP33, pp. 356-368, Apr. 1985.

M. Hagiwara and M. Nakagawa, "A New Decoder for Modulo-PCM", in the VIII-th Symposium on Information Theory and its Applications, Nara, Japan, Dec., 5-7, 1985, pp. 517-522.

Primary Examiner—Benedict V. Safourek
Attorney, Agent, or Firm—Stevens, Davis, Miller & Mosher

[57] ABSTRACT

The invention provides a method of encoding data, e.g. video signals at a lower bit rate for use in digital transmission or recording, and a method of decoding to perform inverse transformation of the encoded data. In the coding method, a block having a plurality of input data is used as an encoding unit. The input data in each block are predicted to obtain estimates thereof. Predictive errors, which are the difference between the input data and the estimates, are evaluated, and a maximum and a minimum of the predictive errors, SX and SN, are determined. A predetermined value larger than SX−SN is used as divisor data OU, which is used in dividing the respective input data to obtain remainders E for each block. The remainders E along with information on the predictive errors, i.e., SX, SN, and OU, are encoded and outputted. In the decoding method, information on a range for the predictive errors and the divisor OU are obtained by use of transmitted additional codes. As a result, offsets (multiples of the divisor OU) can be rightly and uniquely determined in the decoding operation, and by adding the offsets to the transmitted remainders E, the input data can be perfectly reproduced.

19 Claims, 9 Drawing Sheets $F_i = OU \cdot N_i \leq D_i < OU \cdot (N_i+1)$ $S_i = D_i - P_i$
$= D_i - D_{i-1}$ $SDR = SX - SN = 43$ $OU = 2^M > 43 > 2^{M-1}$
$M = 6$
$J = 6$
$E_i = D_i - F_i$
$= D_i - OU \cdot N_i$
$0 \leq E_i < OU$

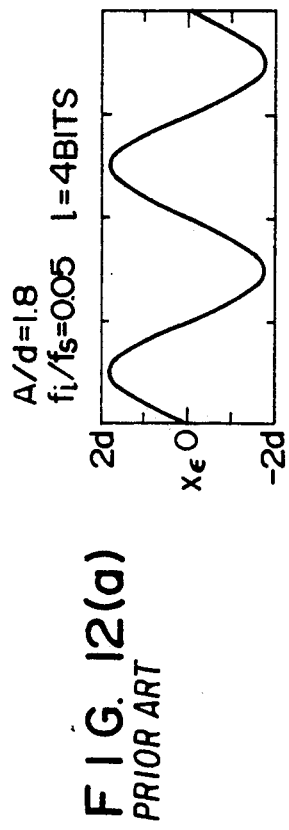
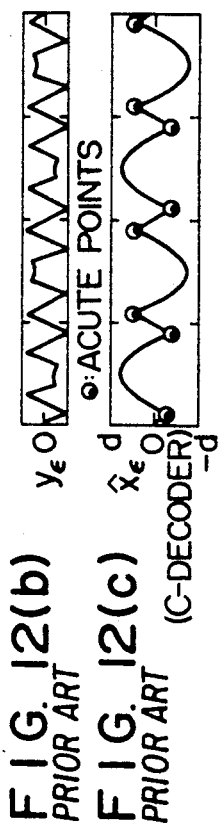
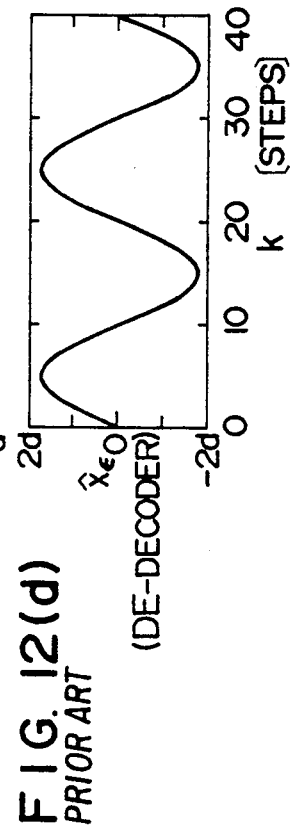
FIG. 10(a) PRIOR ART
FIG. 10(b) PRIOR ART
FIG. 10(c) PRIOR ART
FIG. 10(d) PRIOR ART
EXEMPLARY WAVEFORMS (NO ANOMALY ERRORS)
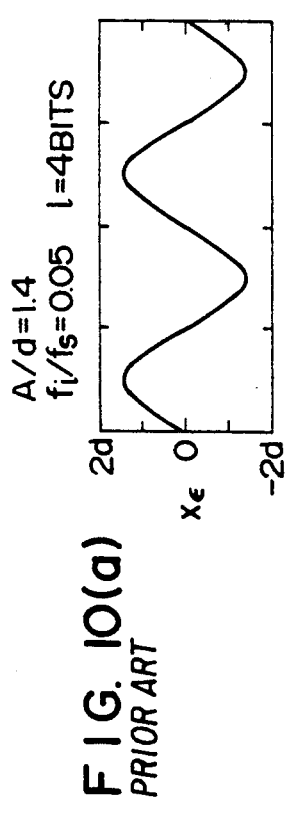
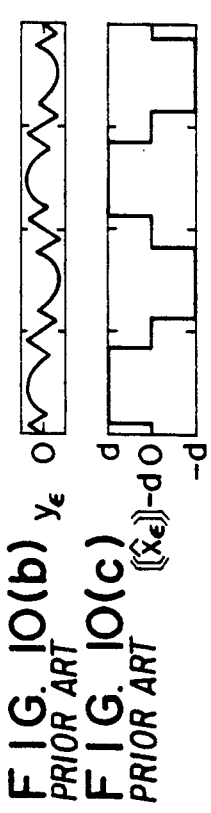
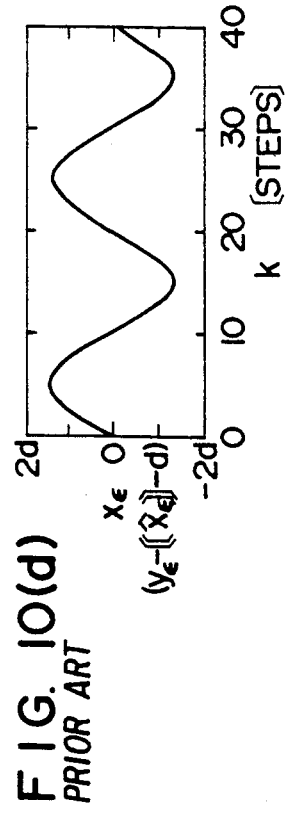
FIG. 12(a) PRIOR ART
FIG. 12(b) PRIOR ART
FIG. 12(c) PRIOR ART (C-DECODER)
FIG. 12(d) PRIOR ART (DE-DECODER)
EXEMPLARY WAVEFORMS (WITH ANOMALY ERRORS)

EFFICIENT CODING METHOD AND ITS DECODING METHOD

BACKGROUND OF THE INVENTION

The present invention relates to an efficient coding method of coding video signals, speech signals and the like at a lesser amount of bit rate and a decoding method of performing inverse transformation thereof for digital transmission or recording.

There have been so far proposed various types of efficient coding methods. Of the coding methods, a DPCM system has such features that the circuit configuration is relatively simple and the reproduced signal is good in quality, though information compression efficiency is low.

Recently, there has been suggested by Ramamoorthy, et al. a speech modulo-PCM (MPCM) system which is a new version of the DPCM system, in the following literatures [1] to [3]. Further, a new type of decoder for the MPCM applications has been presented in the following literature [4] by Hagiwara, et al.

Literatures:
[1] T. Ericson and V. Ramamoorthy, "Modulo-PCM: A new source coding scheme," in Conf., Int. Conf. Acoust., Speech, Signal Processing, ICASSP'79, Washington, D.C., 1979, pp. 419-422.
[2] Ramamoorthy, "Speech coding using Modulo-PCM with side information," in Conf. Rec., Int. Conf. Acoust., Speech, Signal Processing, ICASSP'81, Atlanta, Ga., March 1981, pp. 832-835.
[3] V. Ramamoorthy, "A Novel Speech Coder for Medium and High Bit Rate Applications Using Module PCM Principles," IEEE Trans. Acounst., Speech, Signal Processing, Vol. ASSP33, pp. 356-368 April 1985
[4] M. Hagiwara and M. Nakagawa, "A Decoder for Modulo-PCM," in The VIII-th Symposium on Information Theory and Its Applications, Nara, Japan, Dec., 5-7, 1985, pp. 517-522.

The MPCM system, which has substantially the same circuit configuration as the DPCM system, is advantageous in that overload noise is not present, though granular noise is present as in the DPCM system.

Explanation will be briefly made as to first the MPCM system. The basic arrangement of the MPCM system is shown in FIG. 9, which system comprises an MPCM coder and an MPCM decoder. The MPCM coder includes a modulo operator and a quantizer.

In the drawing, reference symbol $x_k$ denotes an input signal for the k-th sample. The modulo operator has such a saw-tooth shaped input/output characteristics having an amplitude d as illustrated. An output of the modulo operator is expressed as $$((x_k)) = x_k - d \cdot [[x_k]] \qquad (1)$$

where $(-d/2) \leq ((x_k)) < (d/2)$ and $((x_k))$ denotes a constant satisfying the equation (1).

The quantizer receives the output $((x_k))$ of the modulo operator and quantizes it to an l-bit signal as a transmission signal $y_k$ that is then transmitted to the MPCM decoder.

In this way, the MPCM coder 'packs' an input speech signal within the amplitude (from $-d/2$ to $d/2$) for information compression, as shown by (b) in FIG. 10. This is equivalent, in the PCM system, to the transmission of only lower bits.

The MPCM decoder, on the other hand, includes a first-order predictor which performs a calculation in accordance with the following equation (2) and predicts a value $x_k$ at the k-th sampling point from a value $x_k$ at the (k-1)-th sampling point, as shown in FIG. 9.

$$x_k = \rho \cdot x_k \qquad (2)$$

where $\rho$ is a prediction coefficient. The value $x_k$ is quantized according to such a characteristic as shown in FIG. 11 and multiplied by d to obtain an upper bit component $d \cdot [[x_k]]$ which has not been transmitted. The obtained upper bit component is added to the transmission signal $y_k$ to reconstruct the input signal of the coder.

Explanation will next be made as to anomaly error which is a big problem in the MPCM system.

When a difference $\Delta x_k = x_k - x_{k-1}$ between input signals becomes larger in absolute value than $d/2$, it becomes impossible for the decoder to correctly predict the upper bit component $d \cdot [[x_k]]$. As a result, many acute points (at which the waveform abruptly vary) appear in the waveform of the decoder output signal $x_k$ as shown by (c) in FIG. 12. This is called anomaly error which is peculiar to the MPCM system. The anomaly error has been a big problem in the MPCM system to be minimized.

To this end, Ramamoorthy et al. has proposed two types of methods for suppressing the generation of the anomaly error (refer to the literatures [2] and [3] already stated earlier), which methods 1 and 2 will be explained in detail.

Method 1: A decoder is provided within a coder so that, when an anomaly error takes place in the decoder, this is detected and information for correcting the anomaly error is transmitted on another channel as side information.

Method 2: Since a large prediction error provides a high frequency of generation of the anomaly error, input data are grouped into blocks each consisting of N samples and the maximum $E_{mN}$ of the absolute values of the prediction errors for each of the blocks is determined to control the modulo amplitude of the modulo operator and the quantizing steps of the quantizer in accordance with the determined maximum $E_{mN}$. In actual applications, the maximum value $E_{mN}$ is quantized and multiplied by a predetermined coefficient to be used as a modulo amplitude $d_{mN}$ and the $d_{mN}$ is transmitted to the decoder as side information.

Next, problems in the two methods will be examined in detail.

In the case of the method 1, it is indefinite that an anomaly error occurs in which sample in the coded input data. For this reason, in order to completely remove the anomaly errors, correction information must be transmitted for each of the input samples. This is equivalent to an increase in the number of quantizing bits, which leads to a reduction in the coding efficiency. When the number of quantizing bits by the quantizer is large, the anomaly error generation frequency becomes small. Thus, the bit rate of a channel for transmission of side information can be made lower than in the case where correction information is transmitted for every sample, but it is impossible to fully eliminate the anomaly error.

In the case of the method 2, the anomaly error generation frequency can be reduced by optimizing various sorts of parameters. However, since this method is affected by the quantization error of the quantizer and therefore the anomaly error cannot be basically removed, it is impossible to completely eliminate the anomaly error.

Furthermore, there has been suggested by Hagiwara et al. a decoder which has a new decision circuit provided therein to correct anomaly errors without transmission of side information. Since this method cannot detect all the anomaly errors, however, it cannot also be fully remove the anomaly errors (refer to the literature [4]).

Meanwhile, in the case where the input of the MPCM system is a video signal, the anomaly errors cause the visually remarkable deterioration of picture quality. For this reason, the MPCM system has not been so far intended for video signal applications.

SUMMARY OF THE INVENTION

It is an object of the present invention to provide a coding method and its decoding method which can solve the above problems in the prior art.

In accordance with the present invention, the above object is attained by providing a coding method in which a block made up of a plurality of input data for an input signal is used as an encoding unit, a maximum SX and a minimum SN of predictive errors corresponding to differences between the input data of the block and its prediction value are computed, a predetermined value larger than a data (SX−SN) is used as a divisor data OU, remainder E obtained by dividing the respective input data of the block by said divisor data OU are encoded, and additional codes including predictive error information on said data SX, SN and OU as well as encoded codes of said modulos E are both transmitted. In its decoding method, information (the maximum SX and minimum SN of predictive errors) on the predictive error presence range and the divisor data OU are obtained directly or indirectly on the basis of the transmitted additional codes. As a result, offsets (multiple of the divisor data OU) obtained through division in the coding operation can be rightly and uniquely determined in the decoding operation and when the offsets are added to the transmitted modulos E, the input data can be perfectly reproduced. That is, any anomaly errors can be totally eliminated.

BRIEF DESCRIPTION OF THE DRAWINGS

FIGS. 10(a)-10(d) show examples of operational waveforms of signals appearing (in a normal mode) in the related art MPCM system;

FIGS. 12(a)-12(d) show other examples of operational waveforms of the signals appearing (at the time of generating an anomaly error) in the related art MPCM system.

DESCRIPTION OF THE PREFERRED EMBODIMENTS

Figure 1:
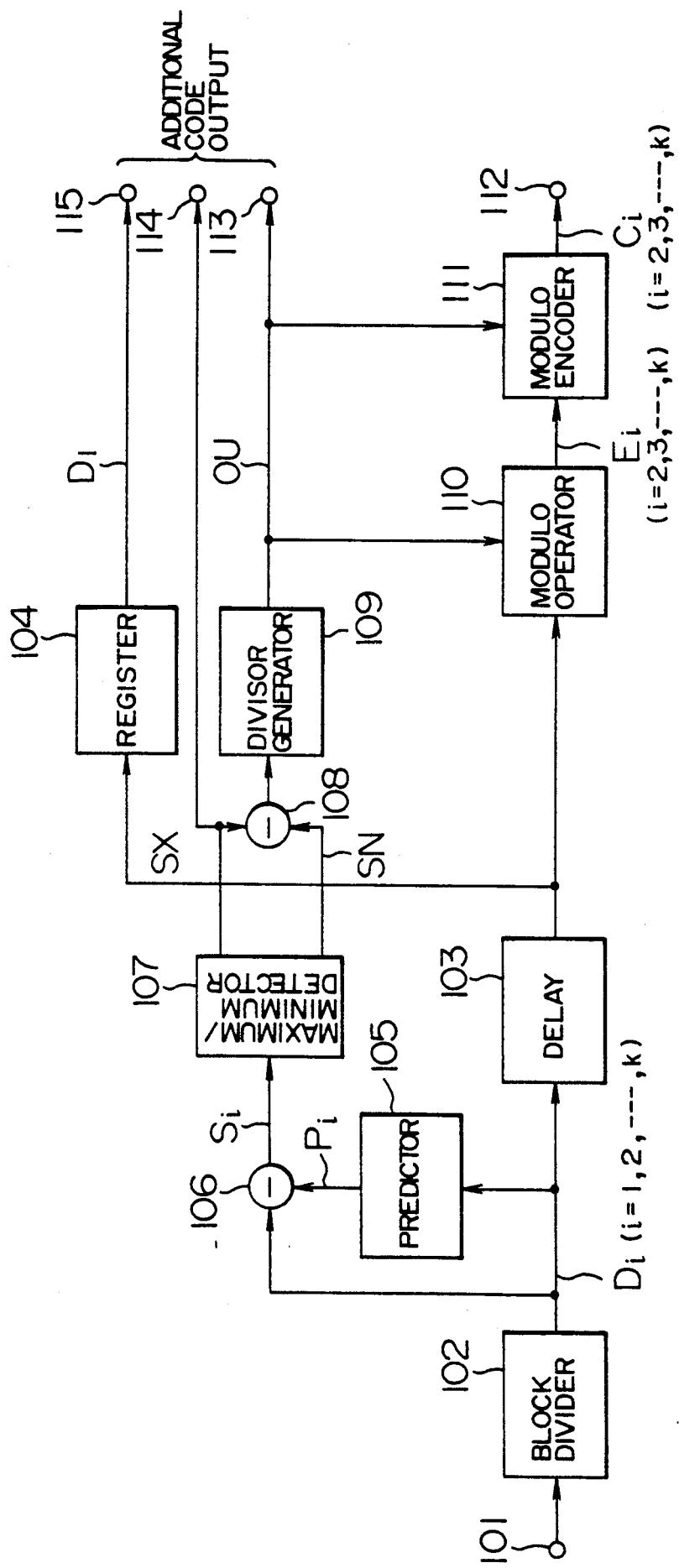
FIG. 1 is a block diagram showing an arrangement of an efficient coder system used in a first embodiment of the present invention.

Prior to detailed explanation of embodiments of the present invention, explanation will first be made as to the principle thereof.

In the case where a plurality (k) of input data (D1, D2, ... and Dk) in the vicinity of a sampling position constitute a block as a coding unit, when the k input data are extracted on one-after-one basis from each of blocks to find differences therebetween, these differences are small due to the signal correlation and the dynamic range (a difference between the maximum and minimum) of these differences is smaller than the dynamic ranges of the input data in most blocks. The difference corresponds to a predictive error when a previous value has been predicted and thus it is hereinafter referred to as the predictive error $S_i$. The present invention is intended to carry out coding more efficient than in the prior art, based on the fact that the dynamic range of the predictive error $S_i$ is smaller than the dynamic range of input data in most blocks.

Assume that SX, SN and SDR denote the maximum, minimum and dynamic range of the predictive error $S_i$ in a block respectively. Then the following equation (1) is satisfied.

$$SDR = SX - SN \tag{1}$$

A divisor OU (corresponding to the modulo amplitude in the MPCM system) is defined as a predetermined value which meets the following relationship (2) and uniquely determined by the dynamic range SDR.

$$OU > SDR \tag{2}$$

Assuming, that $N_i$ and $E_i$ denote a quotient and a remainder or deviation which are obtained by dividing an input data $D_i$ (i=1, 2, ... and k) in a block by the divisor OU respectively, the following equation (3) is satisfied.

$$Di = Ei + OU \cdot Ni \tag{3}$$

where $0 \leq E_i < OU$ and $N_i$ represents an integer.

Reducing the equation (3), $E_i$ is found to be $$Ei = Di - OU \cdot Ni \tag{4}$$

From the equation (4), the remainder $E_i$ can also be considered to be a deviation of the input data $D_i$ from an offset $OU \cdot N_i$, and is hereafter also referred to as "modulo data Ei". The offset $Ou \cdot Ni$ is defined by Fi as follows, $$Fi = OU \cdot Ni \qquad (5)$$

The dynamic range SDR of predictive errors is smaller than the dynamic range of input data in most blocks. Accordingly, when the divisor data OU is set to be small in the equation (2), the divisor data OU can be smaller than the input data dynamic range in most blocks. As a result, when the input data Di can be reproduced or reconstructed from the modulo data Ei, efficient coding can be realized by coding and transmitting the modulo data Ei in place of the input data Di, which is the coding method of the present invention.

Explanation will be made as to how to find the input data Di from the modulo data Ei, that is, how to decode the modulo data Ei into the original input data Di.

For the purpose of decoding the modulo data Ei into the input data Di, it is necessary to reproduce the offset value $Fi = OU \cdot Ni$. Consider that Pi represents an estimate of the input data Di, then the following relationship (6) is satisfied.

$$Pi + SN \leq Di \leq Pi + SX \qquad (6)$$

where SX and SN are the maximum and minimum of the predictive errors as already explained above. Substituting the input data Di expressed by the equation (3) for the term Di in the relationship (6) results in $$Pi + SN - Ei \leq OU \cdot Ni \leq Pi + SX - Ei \qquad (7)$$

Since the estimate Pi (i=2, 3, ...) can be sequentially found from the decoded input data, it is only required that an estimate P1 or F1 (=OU·N1) or N1 be known in addition to the data SX, SN and OU. Because of previous-value prediction, the estimate P1 can be used as a data in the adjacent block which has been already decoded, and its transmission is not necessarily required. Accordingly, when the coder transmits the data SX, SN and OU on predictive error for each block together with the modulo data Ei, the offset $Fi = OU \cdot Ni$ can be uniquely determined in accordance with the relationship (7) and the data Di can be found by adding the determined data Fi to the modulo data Ei, thus completing the decoding operation. Further, when the coder transmits the data attached with any of P1, F1 and N1 for each block, each block in question can be coded and decoded independently of the other blocks and thus can be immune to transmission error, because the input data of other block are not used.

The offset Fi can be uniquely determined because a difference between (Pi+SN−Ei) and (Pi+SX−Ei) is smaller than OU from the definition of OU. Thus, the data OU·Ni satisfying the following relationship (8) and the data OU·Ni satisfying the following relationship (9) correspond respectively to the offset Fi.

$$OU \cdot Ni \geq (Pi + SN - Ei) > OU \cdot (Ni - 1) \qquad (8)$$

$$OU \cdot Ni \leq (Pi + SN - Ei) < OU \cdot (Ni - 1) \qquad (9)$$

In other words, the same offset Fi can be obtained in accordance with any of the relationships (7), (8) and (9).

Since the modulo Ei is a remainder after a division of the input data Di by the divisor data OU, the modulo Ei is zero or larger than zero and smaller than the divisor data OU. Hence, the word length of the modulo data Ei is determined by the size of divisor data OU and becomes variable depending on the block unit.

The number of bits necessary for representation of the data OU is expressed as $\log_2 OU$ and thus the smaller the data OU is the smaller the necessary bit number is. Since the word length L of modulo data is an integer, however, even when a value smaller than $2^M$ satisfying the following relationship (10) is used as the divisor data OU, the word length L will not be changed and thus the coding efficiency will not be improved.

$$2^M > SDR \geq 2^{M-1} \qquad (10)$$

When $2^M$ is set to be the divisor data OU, however, there can be obtained various advantages that the bit number necessary for representation of the data OU can be made smaller, the circuit (for example, divider) for calculating the offset can be simplified, and so on. These advantages will be explained later more in detail.

In the decoder, the data SX, SN and OU are necessary at the time of determining the offset Fi necessary for obtaining the data DI from the modulo data Ei, which has been already explained above. It is also similarly possible to transmit, together with modulo data Ei, the data OU and predetermined values SXX and SNN satisfying the following relationships (11) in place of the data SX, SN and OU, and to determine the offset Fi necessary for decoding with us of these data.

$$SXX \geq SX$$

$$SNN \leq SN$$

$$SXX + SNN = OU \qquad (11)$$

This is because the following relationship (12) can be met.

$$Pi + SNN \leq Di \leq Pi + SXX \qquad (12)$$

where the left equality sign is satisfied when SNN=SN and the right equality sign is satisfied when SXX=SX.

The data SX, SN, SDR, OU, SXX and SNN are information on predictive error and thus will be generally called the predictive error information, hereinafter. In three-data combination SX, SN and OU or SXX, SNN and OU, one data can be determined from the remaining two data. Thus, it is only required to directly or indirectly transmit any two of the three data in the combination as the predictive error information. Further, since the divisor data OU can be uniquely determined from the predictive error dynamic range SDR, the data SDR (=SX−SN) in place of the divisor data OU may be transmitted as one of the predictive error information.

Although explanation has been made as to the case where prediction is made for the previous value in the foregoing, higher-level prediction may be employed.

According to the foregoing coding method, the predictive error information (SX, SN and OU) and modulo data obtained through coding operation become equal respectively to the predictive error information and modulo data obtained through the subtraction of a constant value corresponding to a multiple of the divisor data 0U from all the input data Di in each block. This is because even if the constant value is subtracted from all the input data, the predictive error is the same and if the constant value is an integer multiple of the divisor data OU, the modulo data of the remainder after division thereof by the divisor OU is also the same. For this reason, a decoding method to be explained below is also possible. That is, in the case where all the modulo data Ei (i=1, 2, ..., and k) in a block and the predictive error information (for example, SX and OU) are present, even when the input of the data F1 (or P1 or N1) as an initial value is not finished, decoding operation can preceed as F1=0 and the resultant data (Di−F1) is added to the initial value F1 obtained later to obtain the decoded data Di.

Referring to FIG. 1, there is shown a block diagram of an efficient coder used in a first embodiment of the present invention. In the drawing, the coder includes an input terminal for input of a sampled, quantized video signal as an input data, a block divider 102 for dividing the screen of a picture displayed based on the video signal into small blocks and for outputting input data Di (i=1, 2, ..., and 16) for each of the divided blocks, a delay circuit 103 for timing adjustment for delaying input data corresponding to one block by a predetermined time, a register 104 for holding leading one D1 of data of an output of the delay 103 with respect to each block, a predictor 105 comprising a register receiving an output of the block divider 102 and for outputting as an estimate Pi an input data previous by one, a subtracter 106 for subtracting the estimate Pi from the output of the block divider 102 to obtain predictive errors Si (i=2, 3, ... and 16), a maximum/minimum detecting circuit 107 for finding a maximum SX and a minimum SN of the predictive errors Si received from the subtracter 106 for each block and for holding the maximum and minimum predictive errors of each block in its internal register and also outputting the maximum and minimum SX and SN, a subtracter 108 for subtracting the minimum SN from the maximum SX and outputting a dynamic range SDR of the predictive errors, a divisor generator 109 for receiving the dynamic range SDR from the subtracter 108 and outputting a divisor data OU, a modulo operator 110 for dividing an input data Di from the delay 103 by the divisor data OU to obtain a modulo data Ei (i=2, 3, ..., and 16) corresponding a remainder as a result of the division, modulo encoder 111 for encoding the modulo data Ei according to the size of the divisor data OU, an output terminal 112 of the encoder Ci, a divisor data output terminal 113 of the divisor generator 109, an output terminal 114 for the maximum SX of the predictive errors, and an output terminal 115 for the leading data D1 in a block.

The operation of the coder of the present embodiment having such an arrangement as mentioned above will be explained in the following.

An input data (having an amplitude level of 0−255 and a word length of 8 bits) in the form of a sampled, quantized video signal is applied to the block divider 102 through the terminal 101. The block divider 102, which has a buffer memory provided therein, sequentially writes the input data into the buffer memory and at the same time, reads out the input data Di (i=1, 2, ..., and 16) therefrom. The input data D1 firstly extracted from each block is held in the register 104 and then sent out from the terminal 115 as one of additional codes. The input data applied to the predictor 105 is converted to the estimate Pi and then supplied from the predictor 105 to the subtracter 106. The subtracter 106 subtracts the received estimate Pi from the input data Di and outputs the predictive error Si. The maximum/minimum detector 107 receives the predictive errors Si from the subtracter 106 and outputs the maximum SX and minimum SN of the received predictive errors Si in the associated block. The subtracter 108 receives the maximum SX and minimum SN from the detector 107, performs a subtraction thereof and outputs the predictive error dynamic range SDR. The dynamic range SDR is sent from the subtracter 108 to the divisor generator 109 and outputs the divisor data OU which satisfies the following relationship (10).

$$OU = 2^M > SDR \geq 2^{M-1} \qquad (10)$$

Meanwhile, the input data Di adjusted at the delay 103 with respect to the timing is supplied to the modulo operator 110 which in turn divides the received data Di subjected to the timing adjustment by the divisor data OU and outputs the modulo data Ei (i=2, 3, ..., and 16) corresponding to a remainder as a result of the division. Since the data OU is $2^M$, the modulo data Ei smaller than the data OU can be all expressed with a word length of M bits and without any deterioration. Further, since the modulo data Ei will not exceed the input data Di, the word length of the data OU is 8 or less. The modulo encoder 111 encodes the received modulo data Ei with a bit number J (J=M when M<9 and J=8 when M=9) determined by the size of the divisor data OU to generate a code Ci of variable length subjected to the encoding operation and then outputs the code Ci which is further output from the terminal 112. Because the modulo data Ei are not subjected, in the encoding operation, to any non-linear processings such as truncation of lower bits, the modulo data Ei is not deteriorated by the encoding operation. That is, this encoding operation corresponds to information preserving coding and thus modulo data Ei' obtained by decoding the encoded codes Ci coincides with the original modulo data Ei. The divisor data OU and the predictive error maximum SX as the predictive error information are output from the terminals 113 and 114 respectively as one of additional codes.

Figure 2A:
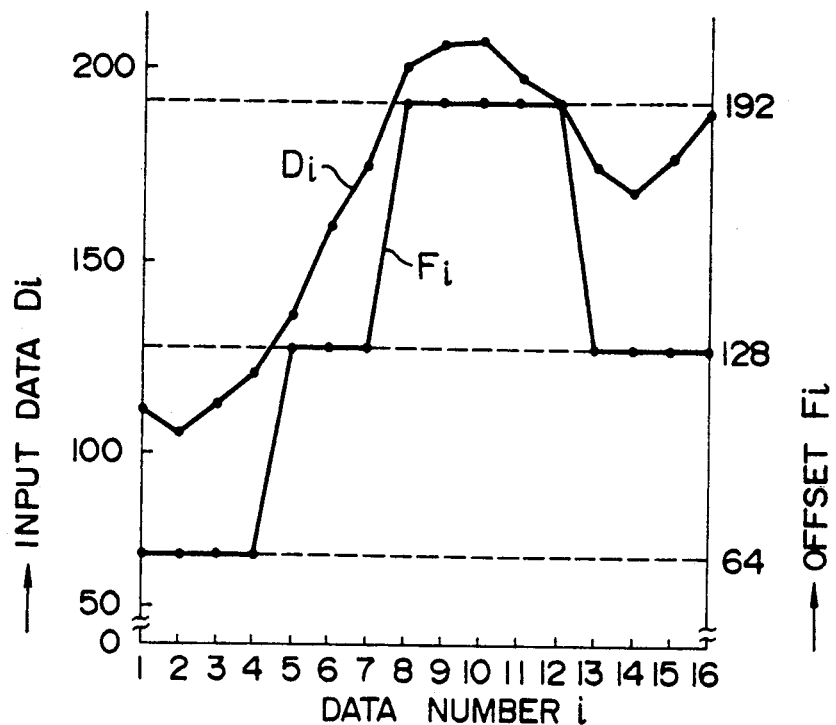
FIGS. 2(a)-2(c) show exemplary data in a block of one-dimensional array.
Figure 2B:
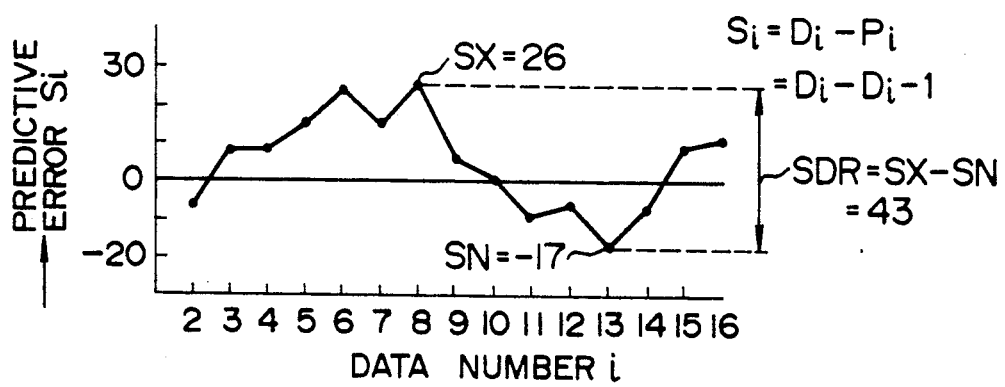
Figure 2C:
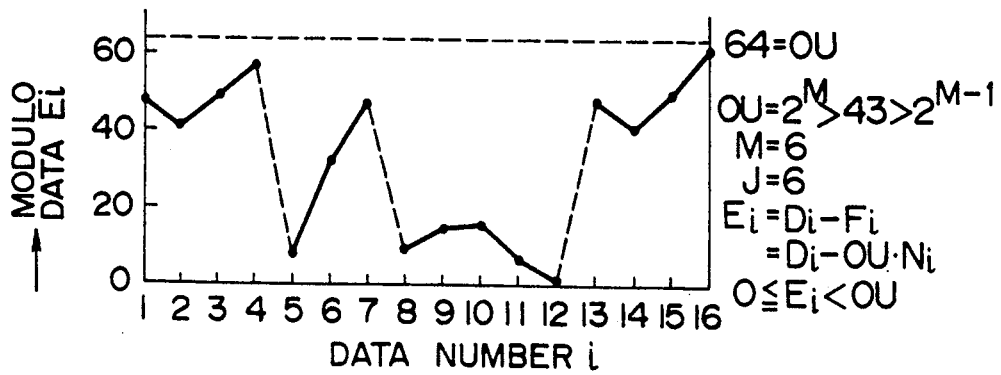

Shown in FIG. 2 are examples of the input data Di, offset Fi, predictive error Si and modulo data Ei when one block is constituted by 16 picture elements in horizontal direction and one line in vertical direction. 16 input data in this block are the data D1, 112, 105, 113, 121, 136, 160, 175, 201, 207, 208, 199, 193, 176, 169, 178 and 190 and extracted in the sequential order from the data D1. In such a one-dimensional block configuration, it becomes unnecessary to provide a buffer memory in the block divider 102 and it is only required to provide within the predictor 105 a single register for holding input data previous by one therein, which results in that the arrangement of the coder can be simplified. The order of data to be extracted from a block of two-dimensional configuration and how to predict will be described later.

Allowable upper and lower limits of the maximums SX in the generated predictive errors are 255 and −255 respectively and similarly allowable upper and lower limits of the minimums SN in the generated predictive errors are 255 and −255 respectively, so that the word length of the maximum and minimum predictive errors SX and SN must be 9 bits. Accordingly, the upper and lower limits of the predictive error dynamic range SDR are 510 and 0 respectively and thus the word length of the dynamic range SDR must be 9 bits. Thus, generally speaking, the divisor data OU also must have a word length of 9 bits. In the present embodiment, however, since the divisor data OU is set to be $2^M$ satisfying the relationship (10), the divisor data OU can be expressed with a word length of a less number of bits. That is, in place of directly transmitting the divisor data OU, it is only required to transmit a power M in $2^M$. The power M can assume one of 0, 1, 2, ..., and 9 and thus the word length of the divisor data OU can be only 4 bits. In other words, the divisor data OU can be transmitted in the form of a 4-bit code M.

The divisor data OU is uniquely defined by the predictive error dynamic range SDR so that the divisor generator 109 can comprise a ROM (read only memory) having 9 bit inputs and 4 bit outputs. However, since the divisor data OU is set to be $2^M$, the divisor generator 109 may also comprise a simple logical circuit which detects the number of successive 0s in the bits of the data indicative of the dynamic range SDR from its uppermost bit.

The modulo operator 110 for obtaining the modulo data Ei corresponding to the remainder after the division of the input data by the divisor data OU may also comprise, in general, a divider or a ROM. In the present embodiment, however, the divisor data OU corresponding to the divisor is set to be $2^M$ so that the modulo operator 110 can be realized with a simple logical circuit which extracts only lower J bits (J=M when M<9 and J=8 when M=9) from the bits of the input data Di and sets the other bits at zero to generate the remainder or modulo Ei after the division by the data OU.

The modulo encoder 111, which encodes modulo data Ei in terms of the bit number J determined by the size of the divisor data OU, can realize with a simple circuit which extracts only lower J bits from the modulo data Ei and which stops the output of the other unnecessary upper bits. Though the output format of the encoded codes Ci may be considered in various ways, the encoded codes Ci are output on a serial data basis in the present embodiment.

In FIG. 1, though not illustrated therein, the output signals of the coder, that is, the additional codes (D1, SX and OU) and the encoded codes (C2, C3, ..., and C16) are once stored in a buffer memory and after completion of coding processing or the like for error correction, they are output onto a transmission line, for example, on a serial data basis.

With the coder of the present embodiment, the total number of bits in the input data Di (i=1, 2, and 16) per one block is 128 (=8×16) and the total number CD of output bits per one block corresponds to a sum of 21 bits (=8+9+4) in the additional codes (D1, SX and OU) of fixed word lengths and 15·J bits in the encoded codes Ci of variable lengths, as follows.

$$CD = 21 + 15 \cdot J \quad (13)$$

The word lengths J of the encoded codes Ci is larger than zero and smaller than 8, but the predictive errors are small and the word lengths J becomes smaller than 7 due to the correlation of the input signal in most blocks. As a result, a relationship $CD = 21 + 15 \cdot J < 128$ is satisfied and an average bit number per one sample (one picture element) can be reduced. In the exemplary block shown in FIG. 2, the divisor data OU is 64 and thus the word length J of the code Ci becomes 6. Hence, the total output bit number CD of the coder in this block is 111 (<128) in accordance with the equation (13) and the average bit number per one sample is reduced to about 6.9.

Figure 3:
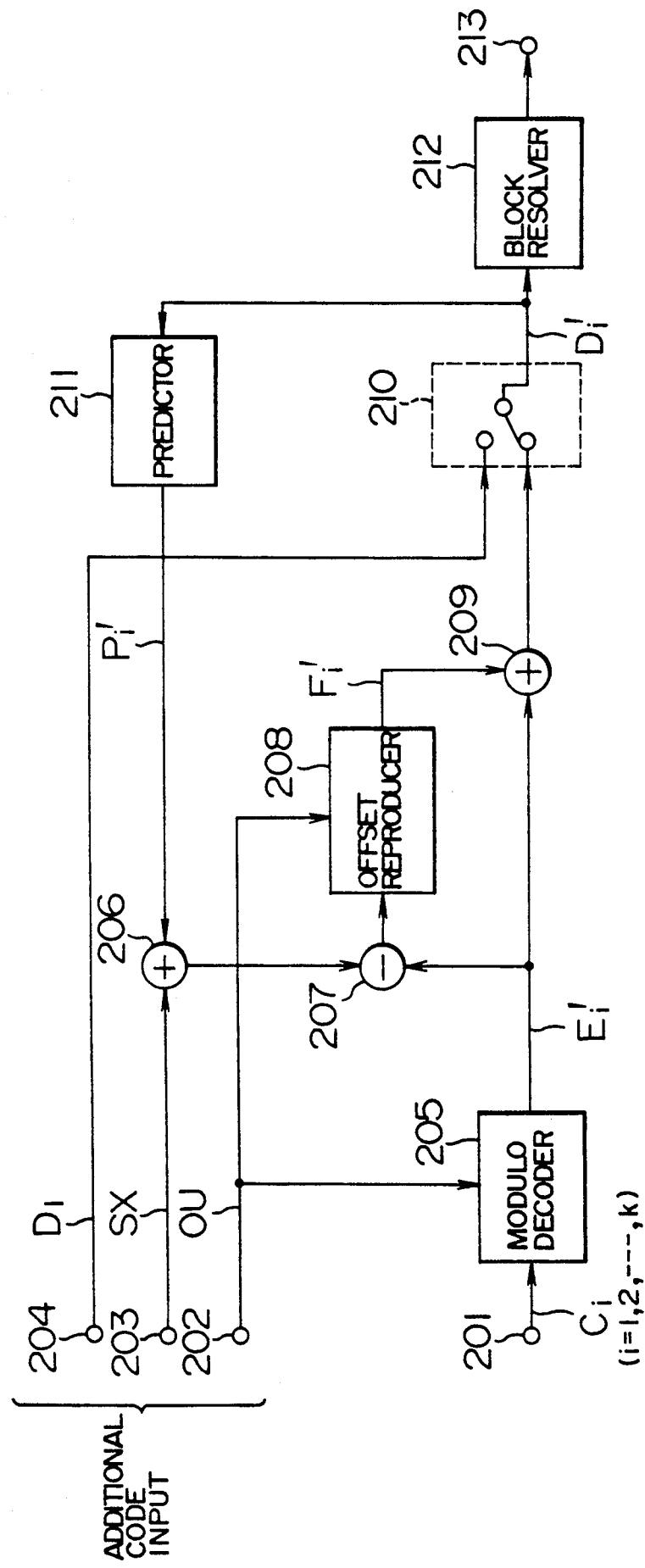
FIG. 3 is a block diagram showing an arrangement of a decoder system used in the first embodiment.

FIG. 3 shows a block diagram showing the arrangement of a decoder used in the first embodiment of the present invention, which decoder performs inverse transformation opposed to in the coder of FIG. 1. Here, data treated in the decoder are shown with an apostrophe to distinguish them from data treated in the coder. For example, input data D1, D2, ..., D16 in the block to the coder are encoded, and the decoder decodes this data and outputs the data as D1', D2', ..., D16'.

The decoder of FIG. 3 includes an input terminal 201 for input of the codes Ci, an input terminal 202 for input of the divisor data OU, an input terminal 203 for input of the maximum predictive error SX, an input terminal 204 for input of the leading data D1 in each block, a modulo decoder 205 for performing inverse transformation opposite to in the modulo encoder 111 used in the efficient coder of FIG. 1, that is, for decoding the codes Ci to obtain the modulo data Ei, an adder 206 for receiving, as its one input, the maximum predictive error SX, a subtracter 207 for subtracting the modulo data Ei from an output received from the adder 206, an offset reproducer 208 for receiving an output of the subtracter 207 and the divisor data OU and for generating and supplying an offset Fi', an offset adder 209 for adding the offset Fi' to the modulo data Ei' to obtain a decoded data Di', a switch 210 for receiving an output of the offset adder 209 and the data D1 from the terminal 204 and selecting one of the received inputs, a predictor 211 having the same arrangement as the predictor 105 in FIG. 1 and for receiving the decoded data Di' and for supplying the estimate Pi to the other input of the adder 206, a block resolver 212 which receives the decoded data Di' from the switch 210 and performs inverse transformation opposite to in the block divider 102 in FIG. 1, and an output terminal 213 for input of the decoded data. It is assumed that the input of the additional codes is followed by the input of encoded data and held in the decoder for one block period.

Explanation will next be made as to the operation of the decoder system arranged as mentioned above.

The input data D1 applied to, the terminal 204 passes through switch 210 and and is supplied the block resolver 212 and also to the predictor 211 as decoded data D1'. The data D1' is used, in the predictor 211, as an estimate P2' which is necessary for calculating the decoded data from the initial modulo data E2'. The switch 210, after outputting the input data D1, selects the input from the offset adder 209 and outputs the decoded data D2', D3', ..., and D16'.

The encoded codes Ci (i=2, 3, ..., and 16) applied to the terminal 201 are converted at the modulo decoder 205 into modulo data Ei' on the basis of the divisor data OU received from the terminal 202. The adder 206 receives the maximum predictive error SX from the terminal 203 and the estimate Pi' (=Di−1') from the predictor 211, adds them together and then sends the addition result to a subtracter 207. The subtracter 207 subtracts the modulo data Ei' from the received addition result to obtain a data (Pi'+SX−Ei'). The offset reproducer 208 receives the subtraction result from the subtracter 207 and the divisor data OU from the terminal 202 to generate the offset Fi'(=OU·(Ni+1)) satisfying the following relationship (9)

$$OU \cdot Ni \leq (Pi' + SX - Ei') < OU \cdot (Ni + 1) \quad (9)$$

The offset adder 209 addes the offset Fi' received from the offset reproducer 208 to the modulo data Ei' from the modulo decoder 205 to generate the decoded data Di' (i=2, 3, ..., and 16) and supplies the data Di' to the switch 210.

The switch 210 gets the decoded data D1' (=D1) from terminal 204 and decoded data Di' (i=2, 3 ..., 16) from adder 209 and supplies all the decoded data Di' (i=1, 2, ..., 16) in the block and supplies them to the predictor 211 and also to the block resolver 212. The decoded data Di' applied to the block resolver 212 are extracted in the same order as the data obtained by sampling and quantizing the original video signal and are output from the terminal 213.

The word length J of the encoded codes Ci applied to the terminal 201 on a serial data basis varies from block to block. Thus, in order to correctly extract the codes Ci, it is necessary to know the word length J. Since the word length J of the encoded codes Ci is determined by the power M (in $2^M$) indicative of the divisor data OU (J=M when M<9 and J=8 when M=9), the encoded codes Ci can be corrected extracted and the modulo data Ei' can be obtained by attaching 0 to its upper bits. As a result, the modulo decoder 205 can be realized with such a simple circuit that comprises a shift register for serial-parallel conversion, a register for holding code data therein, a counter for counting the number of bits and a gate for attaching 0 to upper bits. The modulo encoder 111 in FIG. 1 is not subjected to any deterioration by the encoding operation and the modulo decoder 205 performs inverse transformation opposite to in the modulo encoder 111, so that the modulo data Ei' coincides with modulo data Ei.

The module can be obtained by dividing the (Pi'+SX−Ei') of the output of the subtracter 207 by the divisor data OU and the offset Fi' (=OU·Ni) satisfying the relationship (9) by subtracting the obtained modulo from the output data (Pi'+SX−Ei'). In the present embodiment, the divisor data OU is set to be $2^M$, so that the offset Fi' can be obtained only by setting all the lower M bits of the data (Pi'+SX−Ei') at 0. As a result, the offset reproducer 208 can be realized with use of a simple logical circuit.

Since the modulo data Ei' and the estimate Pi' in the decoder system are equal to the modulo data Ei and the estimate Pi in the coder system of FIG. 1, the offset Fi' is also equal to the offset Fi and the decoded data Di' coincides with the input data Di.

As has been explained in the foregoing, in accordance with the present embodiment, unlike the modulo-PCM (MPCM) system having a quantizer, there is not provided a quantizer, the modulo data is transmitted as coded as it is, the divisor data OU (modulo amplitude in the MPCM system) ar set to be larger than the predictive error variation range (dynamic range), and further the divisor data OU and the information on the predictive error variation range are transmitted as the additional codes. As a result, any anomaly errors and quantization errors can be eliminated, that is, information preserving coding and its decoding can be realized, whereby the circuit configuration can be highly simplified.

In the prior art, the divisor data (modulo amplitude) in the coding operation has been fixed or set to be a maximum of absolute values of predictive errors; whereas, in the present invention, the divisor data is determined by the predictive error variation range (dynamic range) so that the divisor in the coding operation can be made smaller than that in the prior art. Accordingly, in particular, in a block in which an input data is monotonously increased or decreased, coding can be realized more efficiently than the prior art. In the case where a video signal is used as an input signal, since rough picture image can be reproduced with use of only a part (the leading picture element data of the block) of the additional codes, so that coding suitable also for picture research can be realized.

There is also considered such a coding method that, in place of an input data at a specific position in a block, an average value DA of the input data in the block is transmitted as one of the additional codes. In this case, its decoding is carried out by first decoding the coded signal under the condition of the initial value F1=0 of the offset and by computing an average value DB of the obtained data (Di−F1). The initial value F1 of the offset is obtained by subtracting the average value DB from the transmitted average value DA. The decoded data Di is obtained by adding the obtained initial value F1 to the data (Di−F1). In the case where all of k modulo data Ei are transmitted, even if a single error occurs in the modulo data, correction can be effected by using the average value DA. Further, when a video signal is input as an input signal, the rough information of the video signal can be displayed with use of only the average value DA and thus coding suitable for searching can be realized.

When coded data on the transmission line are subjected to an error, or when a code error takes place on the transmission line, the error is not always propagated to the decoding of the next sample unlike the DPCM system. This is because the decision of the offset Fi in accordance with the relationships (7), (8) and (9) has a determination width determined by the maximum and minimum of the predictive errors. However, an error sometimes occurs in the decision of the offset Fi and the error of the offset Fi is propagated to decoded data following the error occurrence. Even under such a condition, since, the estimate Pi is obtained without using any data in the other blocks, i.e., by performing coding operation over each block independently, such an error will not be propagated up to the adjacent block. In addition, since the propagation of right decoded data and an error causes a difference between the right and wrong decoded data to correspond to an integer multiple of divisor data OU, such wrong data can be accurately corrected by judging a correlation between the wrong decoded data and the adjacent right decoded data.

How to correct the wrong data will be explained. An error occurrence position can be detected with use of an error correcting code. Assume, for example, that a code error took place in the ninth modulo data in the diagram of FIG. 2(c) and this caused the offset Fi to be wrongly determined. This will result in that the tenth to sixteenth data subsequent to the ninth modulo data are also erroneously decoded. To avoid this, decoding is carried out by predicting in a direction opposite to in the coding operation starting from the seventeenth data (not shown in FIG. 2) corresponding to the leading data of the next block to which the error is not propagated. As a result, the sexteenth, fifteenth, ..., and tenth input data can be rightly decoded so long as a difference between the seventeenth and sixteenth data does not exceed the predictive error dynamic range. In this connection, since the prediction direction is different from that in the coding operation and the sign of the predictive error is inversed, the minimum and maximum transmitted in the form of the additional codes must be used with their sign inversed. The ninth input data can be corrected with use of an average value of the eighth and tenth decoded data.

When a predictive error in the block boundary (corresponding to a difference between the sixteenth and seventeenth data, in the example of FIG. 2) obtained through prediction using decoded data is in a zone outside the predictive error range determined by the additional codes, it can be judged that there is a high possibility of transmission error occurrence. When a transmission error is judged and thus the predictive error is out of the range, decoding can be achieved by predicting in a direction different from in the coding operation starting from a decode data within the next block in the same manner as mentioned above.

The block of FIG. 2 has been of one-dimensional configuration. When the block is of two- or higher-dimensional configuration as in a video signal, such correction can be attained with use of decode data within a plurality of surrounding blocks. When a transmission error takes place in the additional codes indicative of the predictive error information, there is considered a correction method of using the additional codes of the adjacent block. There is also considered such a coding method that one of the adjacent blocks to be suitably used in correction is previously determined at the time of occurrence of a transmission error and this information is transmitted as one of the additional codes, in which case more suitable correction can be realized.

The foregoing first embodiment, which is the variable-length coding method wherein the coding bit number varies from block to block, is suitable for such applications not requiring real-time transmission as, for example, file recording of stationary picture images, short-sentence voice signals and so on.

Explanation will next be made as to a coding method of the present invention which is suitable for usual constant-bit-rate transmission line and first as to its principle briefly.

One method of making constant the bit rate is to make constant the coding bit number for each block, that is, to set the predictive error dynamic range to be below a predetermined amount. In the present invention, an input signal is subjected to such a conversion as to set the predictive error dynamic range to be below the predetermined amount, to thereby obtain a converted input signal that is then subjected to an information preserving coding (which is the same as already mentioned in the foregoing embodiment) to obtain a coded output. The coded output is then subjected to a decoding operation (which is the same as already mentioned in the foregoing embodiment) to reproduce the converted input signal which in turn is then subjected to a conversion opposite to in the coding operation to thereby reproduce the input signal.

The simplest way of obtaining the converted input signal is to multiply the input signal by a predetermined number for each block. When the input signal is multiplied by the predetermined number smaller than 1, the converted input signal having the smaller dynamic range can be obtained and the predictive error dynamic range of the converted input signal can be made smaller by substantially the predetermined number than the predictive error dynamic range of the input signal. This is because the processing of obtaining the predictive errors is linear.

Figure 4:
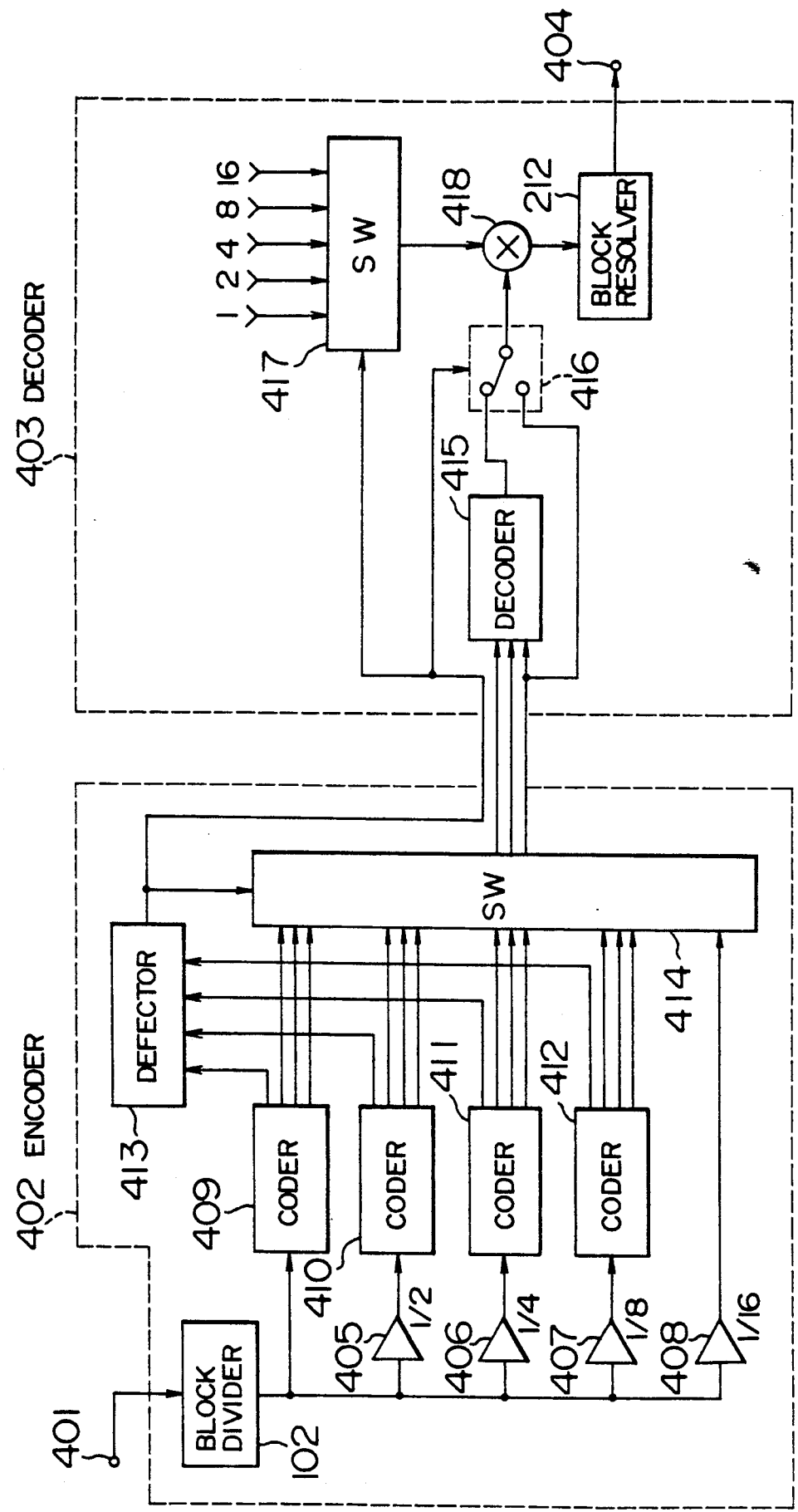
FIG. 4 is a block diagram showing the arrangements of an efficient coder and its decoder used in a second embodiment of the present invention.

Referring to FIG. 4, there are shown, in a block diagram form, a coding and decoding system in accordance with a second embodiment of the present invention. The coding system functions to make constant the number of coding bits for each block.

The coding and decoding system in FIG. 4 includes an input terminal 401 to which an input data as a sampled, quantized video signal (having a word length of 8 bits and a level of 0-255) is to be applied, an encoder 402 for making constant the number of coding bits for each block, a decoder 403 for performing inverse transformation opposite to the transformation of the encoder 402, and an output terminal 404 from which the decoded input signal in a block unit is to be output.

More in detail, the encoder system 402 has a block divider (which is the same as the block divider 102 in FIG. 1), coefficient appliers 405, 406, 407 and 408 multiplying the input signal by coefficients ½, ¼, ⅛ and 1/16 respectively, coders 409, 410, 411 and 412 respectively having the same internal configuration as in FIG. 1 but with the block divider 102 being removed and for performing information preserving coding operation to output additional codes and encoded codes, a detector 413 for receiving from the coders 409 to 412 divisor data OU respectively indicative of the word length of the encoded code that is one of the additional code outputs of each of the coders 409 to 412 and for outputting conversion information, and a switch 414 for receiving outputs of the coders 409 to 412 and an output of the coefficient applier 408 and the conversion information from the detector 413 and, under control of the received conversion information, for selectively outputting, if present, one of the outputs of the coders 409 to 412 which reaches 4 bits in its encoded data word length and for selectively outputting, if not present, the output of the coefficient applier 408.

The decoder system 403, on the other hand, has a block resolver 212 (which is the same as the block resolver 212 in FIG. 3), a decoder 415 having the same internal arrangement as in FIG. 3 but with the block resolver 212 being removed, a switch 416 for receiving an output of the decoder 415 and one of the encoded codes from the switch 414 and for outputting one of the received inputs under control of the conversion information transmitted from the detector 413, a switch 417 for selectively outputting one of predetermined coefficients under control of the conversion information transmitted from the detector 413, and a multiplier 418 for multiplying the reproduced conversion signal from the switch 416 by the selected predetermined coefficient received from the switch 417 for reproduction of the input signal.

Explanation will next be made as to the operation of the encoder system 402 of the present embodiment arranged as explained above.

In the encoder system 402, an input signal applied to the terminal 401 is divided on a block unit-data basis at the block divider 102 into block signals. The coefficient appliers 405 to 408 multiply the received block signal by the predetermined coefficients ½, ¼, ⅛ and 1/16 and round the decimal fractions of their multiplication results respectively to generate conversion input signals (including the input signal) having word lenths of 8, 7, 6, 5 and 4, which conversion input signals are then sent to the coders 409 to 412 to be subjected to an information preserving coding operation respectively. The detector 413 detects one of the coders where the word length of the encoded code becomes 4 bits. The switch 414 is controlled by the output of the detector 413 to selectively output one of the encoded codes which becomes 4 bits in word length. The switch 414, if failing to detect any of the coders which becomes 4 bits in word length, selects the output of the coefficient applier 408 and outputs it as an encoded code as it is. Since it is necessary to transmit information (3 bits) to the decoder 403 to inform the decoder of one of the conversion input signals which has been encoded and transmitted, the information as the conversion information is included in the additional codes and transmitted. Assume that the lower limit value of the word lengths of the encoded codes is set to be 4 bits in the coder 409. Accordingly, the amount of information to be transmitted becomes a total of 80 bits, that is, 3 bits of conversion information for the additional codes, 8 bits (at least) of block leading data, a maximum of 9 bits (at least) of predictive error and 4×15 bits of encoded codes. Thus, the number of bits per one picture element becomes 5 bits in average.

In the decoder system 403, the decoder 415 decodes the encoded data transmitted from the encoder system 402 to decode the conversion input signal in the encoder system without any error. The decoded conversion input signal from the decoder 415 is applied through the switch 416 to the multiplier 418 as its one input. The switch 417 selects and outputs one of the inverse conversion coefficients under control of the conversion information transmitted from the detector 413 for conversion of the decoded conversion input signal into the input signal. The multiplier 418 multiplies the conversion input signal by the selected inverse conversion coefficient received from the switch 417 to convert it into the input signal. The reproduced block input signal is resolved at the block resolver 212 so that a signal having the same data array as the input signal of the block divider 102 is output from the block resolver to the terminal 404. When the transmitted encoded data is determined to be the output of the coefficient applier 408 on the basis of the transmitted conversion information, since the encoded data corresponds to the conversion input signal per se, the encoded data is not passed through the decoder 415 and applied to the multiplier 418 through the switch 416.

As has been explained above, when it is impossible, in encoding the input signal, to encode the input signal with the predetermined encode data word length, the input signal is multiplied by the predetermined coefficient to form the conversion input signal having a small predictive error dynamic range and then the obtained conversion input signal is encoded, whereby the encode data word length can be made constant. Since the coding operation of the conversion signal is the same as that of the first embodiment, that is, information preserving coding, no anomaly errors take place. When the input signal is large in predictive error dynamic range, the input signal is multiplied by the predetermined coefficient to be converted into the conversion input signal, which is then encoded, so that quantization becomes rough. Large ones of the predictive errors in the dynamic range mean sharply varying points (acute points) in the input signal. The sharply varying points in the signal, even when the quantization is rough, is immune to the signal deterioration, which results in that practical coding matching visual characteristics can be realized.

For easy understanding of the present invention, the four coders 409 to 412 have been illustrated. However, most of the circuit parts in the second embodiment can be commonly used and thus the circuit scale of the second embodiment will no increased remarkably.

In the second embodiment, since the conversion coefficients for conversion of the input signal to the conversion input signal are fixed in value and small in type number, the dynamic range of the encode data may not effectively utilized in some cases. To sove this problem, a third embodiment of the present invention to be explained below is provided.

Figure 5:
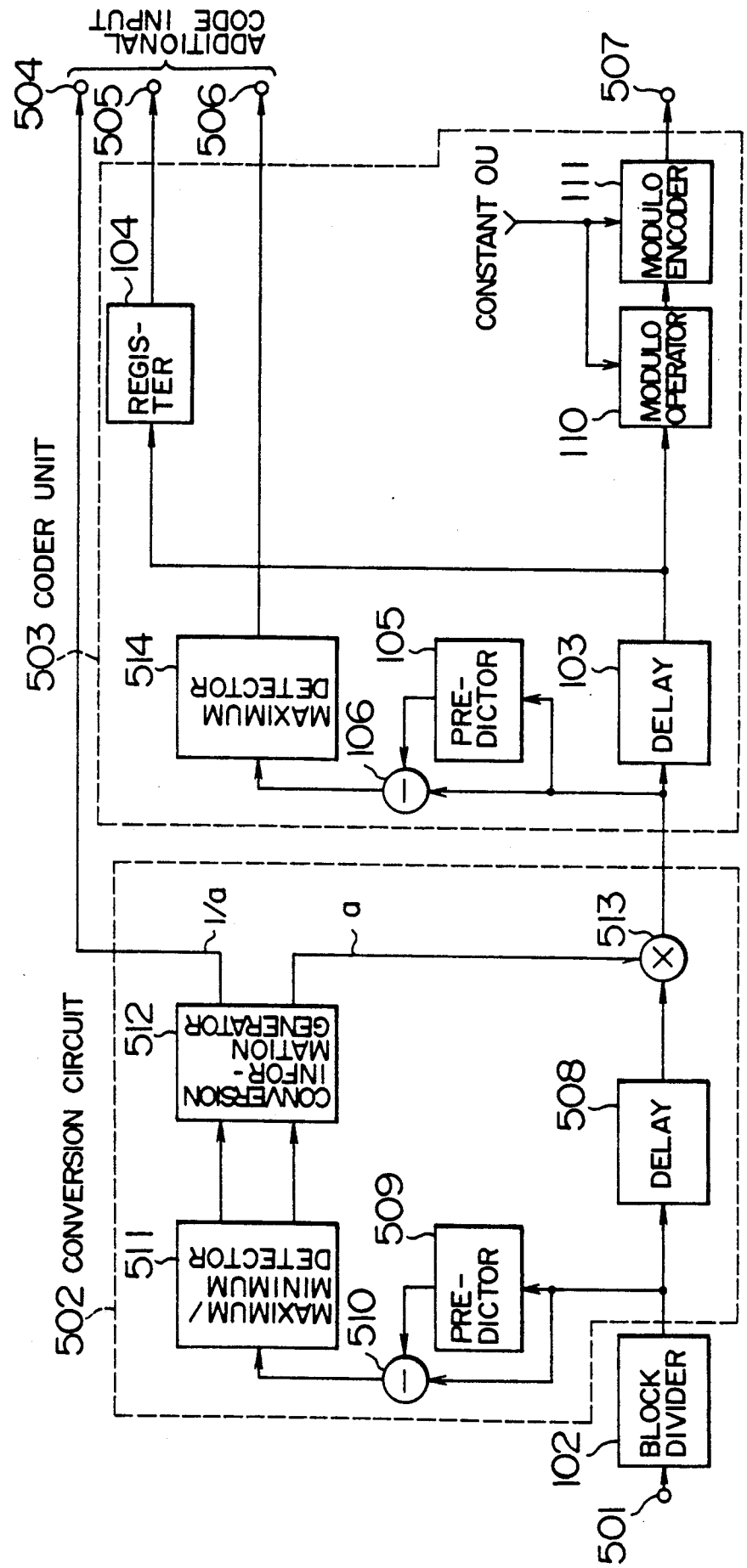
FIG. 5 is a block diagram showing an arrangement of an efficient coder system used in a third embodiment of the present invention.

Shown by a block diagram in FIG. 5 is a coder system in a third embodiment of the present invention, which system includes an input terminal 501 for input of a sampled, quantized video signal as an input signal, a block divider 102 (which is the same as the block divider 102 in FIG. 1), a conversion circuit 502 for generating conversion information and conversion coefficients, multiplying the input signal by the conversion coefficients to form a conversion input signal and then outputting the conversion input signal, a coder unit 503, an output terminal 504 for the conversion information (inverse conversion coefficient 1/a), an output terminal 505 for a leading data $d_1$ within a block of the conversion input signal, an output terminal 506 for a maximum sx of predictive errors for conversion input data, and an output terminal 507 for encoded data $c_1$.

More specifically, the conversion circuit 502 includes a delay 508, a predictor 509, a subtracter 510, a maximum/minimum detecting circuit 511, a conversion information generating circuit 512 for receiving the maximum and minimum predictive errors from the maximum/minimum detector 511 and for outputting, on the basis of the received maximum and minimum, the conversion information (conversion coefficient a and inverse conversion coefficient 1/a) for generation of the conversion input signal, a multiplier 513 for multiplying an input signal from the delay 508 by the conversion coefficient from the conversion information generator 512, these elements 508, 509, 510 and 511 being the same as the associated elements 103, 105, 106 and 107 respectively.

In the coder unit 503, the same parts as those in FIG. 1 are denoted by the same reference numerals. That is, the coder unit 503 includes a delay 103, a register 104, a predictor 105, a subtracter 106, a modulo operator 110, a modulo encoder 111, and a maximum/minimum detecting circuit 514 for detecting a maximum of predictive errors received from the subtracter 106 for each block, holding the maximum in its internal register and outputting it for each block.

Explanation will next be made as to the operation of the coding system of the present invention arranged as mentioned above.

The sampled, quantized video signal applied to the terminal 501 as an input data, is supplied to the block divider 102 where the input signal is divided on a block unit data basis into block signals. The conversion circuit 502 receives the block signal, multiplies it by the fixed conversion coefficient a for each block, and rounds the multiplied signal with respect to its fractional part to form the conversion input signal. How to determine the conversion coefficient a will be explained later.

The coder unit 503 receives the conversion input signal from the conversion circuit 502 and encodes it in the same manner as in the first embodiment (FIG. 1) of the present invention. That is, the conversion input signal is previously subjected at the conversion circuit 502 to such conversion that the coder unit 503 enables information preserving coding of the conversion input signal with a fixed word length of L bits. Thus, it is unnecessary to newly find the divisor data OU. For this reason, the coder unit 503 has the same arrangement as the coder system of FIG. 1 but with the subtracter 108 and the divisor generator 109 being removed. Further, the conversion input signal is already a block signal and thus the block divider 102 is also removed in the coder unit 503. Since the encoded data has a constant word length of L, that is to say, since the divisor data 0U is always constant, it is unnecessary to transmit it as the additional code. The coder unit 503 outputs the maximum SX of predictive errors and the leading data $d_1$ in each block for the conversion input signal and the encoded codes. In addition, the conversion information (inverse conversion coefficient 1/a) is necessary for the purpose of inversely converting into the original input signal the conversion input signal encoded and transmitted, the conversion information is transmitted as one of the additional codes.

The conversion coefficient a is determined as follows. That is, in the conversion circuit 502, a difference between the output of the predictor 509 and the input signal, i.e., a predictive error is computed by the subtracter 510. The maximum/minimum detecting circuit 511 computes and outputs the maximum SX and minimum SN of predictive errors for each block of the input signal. This results in that the predictive error dynamic range SDR of the input signal becomes (SX−SN). Meanwhile, the word length of the encoded code in the coder unit 503 is L bits, so that the predictive error dynamic range sdr (sdr=sx−sn when sx and sn are the maximum and minimum of predictive errors for the conversion input signal respectively) of the conversion input signal must satisfy the following relationship (14).

$$sdr \leq (2^L - 1) \qquad (14)$$

In the event where the multiplier 514 has no rounding error, when the conversion coefficient a is set to be $(2^L-1)/(SX-SN)$, the predictive error dynamic range SDR of the conversion input signal can be set to be $(2^L-1)$ and efficient coding can be realized. In practice, however, the multiplier 514 has a certain rounding error and thus sx=R(a·SX) and sn=R(a·SN) are not necessarily satisfied (where R(x) represents a value after rounding the x with respect to its fractional part). In order that the predictive error dynamic range sdr always satisfies the relationship (14) even in the presence of a rounding error, the conversion coefficient a is set to be smaller than $(2^L-1)/(SX-SN)$. That is, there is such a case that sx is larger than R(a·SX) or sn is smaller than R(a·SN), in which case sdr becomes larger than a·SDR. The maximum (worst value) of the rounding error is 1. Accordingly, in order to satisfy the relationship (14) even in the worst condition caused by the rounding error, the conversion information generating circuit 512 is set to generate the conversion coefficient a satisfying the following relationship (15).

$$(2^L - 3) \geq R(a \cdot SX) - R(a \cdot SN) \qquad (15)$$

The conversion information generator 512 can be easily realized by a ROM (read only memory) which stores therein the previously computed conversion coefficient a satisfying the relationship (15). When the predictive error dynamic range SDR of the input signal satisfies the following relationship (16), the conversion coefficient becomes 1.

$$SDR \leq (2^L - 1) \qquad (16)$$

Figure 6:
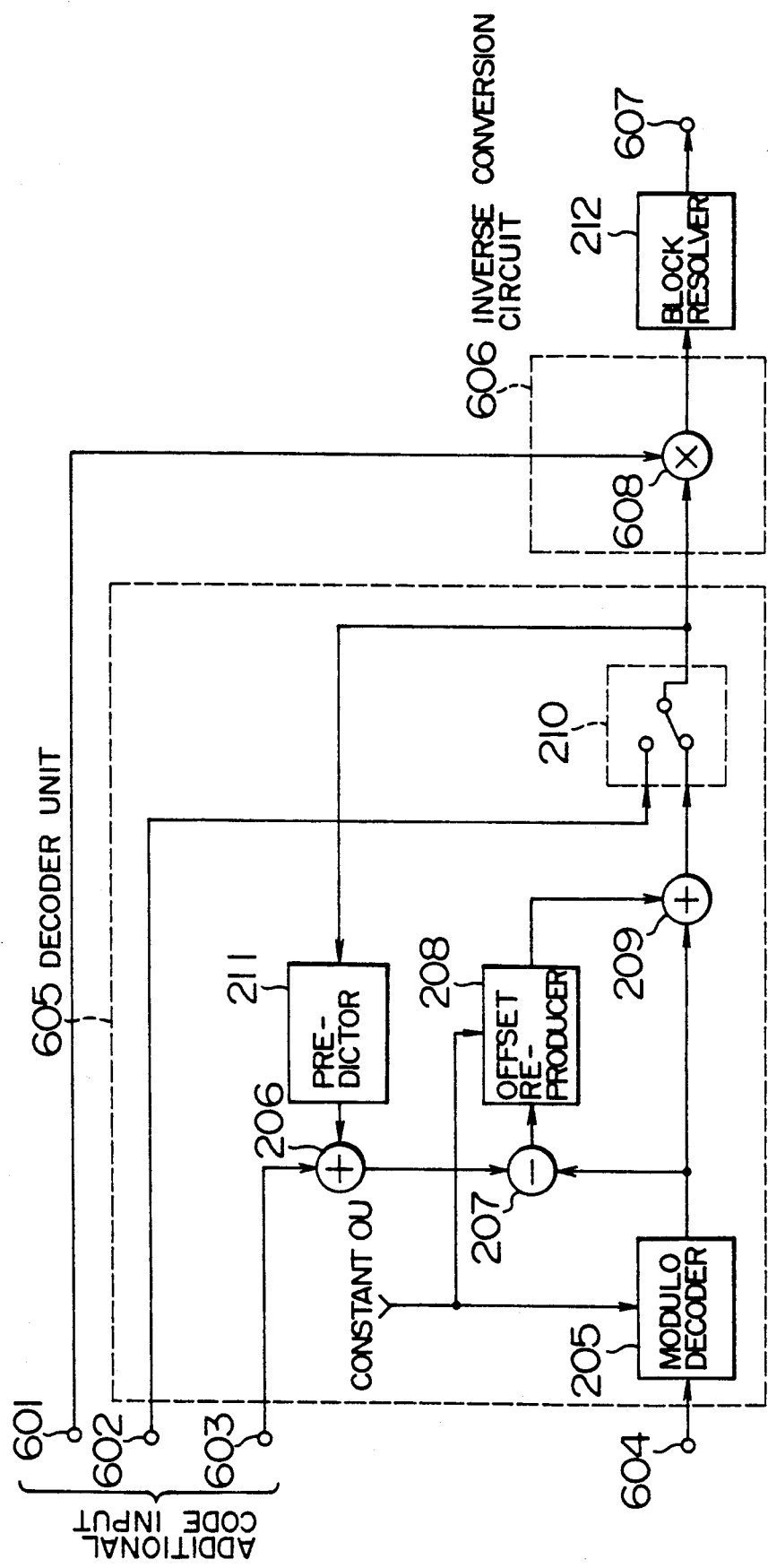
FIG. 6 is a block diagram showing an arrangement of a decoder system used in the third embodiment of the present invention.
Figure 7A:
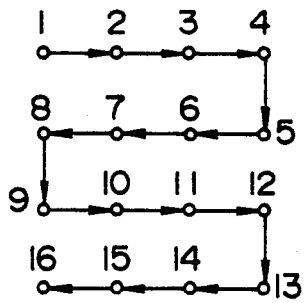
FIGS. 7(a)-7(h) show diagrams for explaining the sequence of data to be extracted from a block and a predicting method.
Figure 7B:
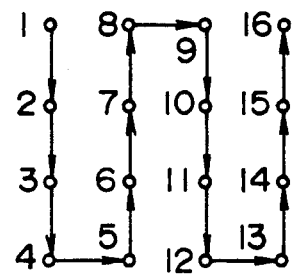
Figure 7C:
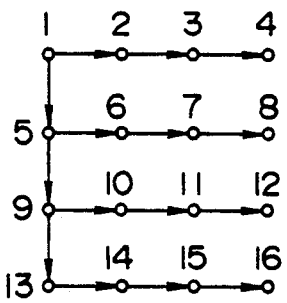
Figure 7D:
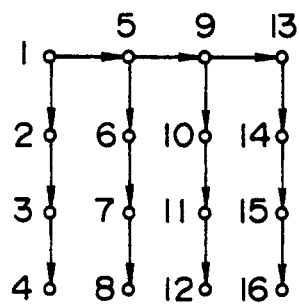
Figure 7E:
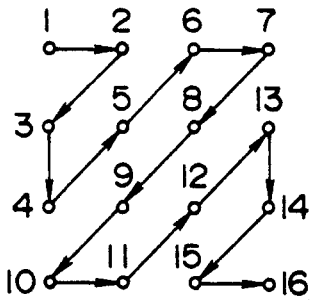
Figure 7F:
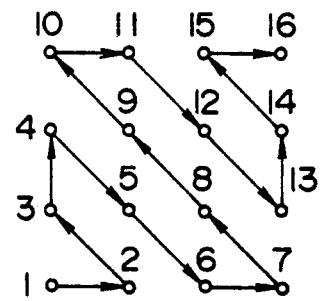
Figure 7G:
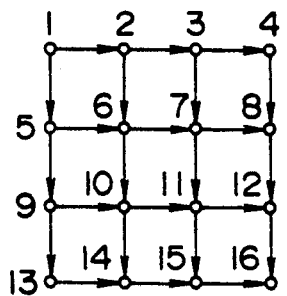
Figure 7H:
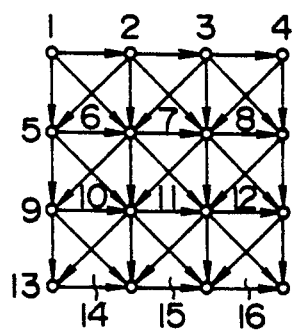
Figure 11:
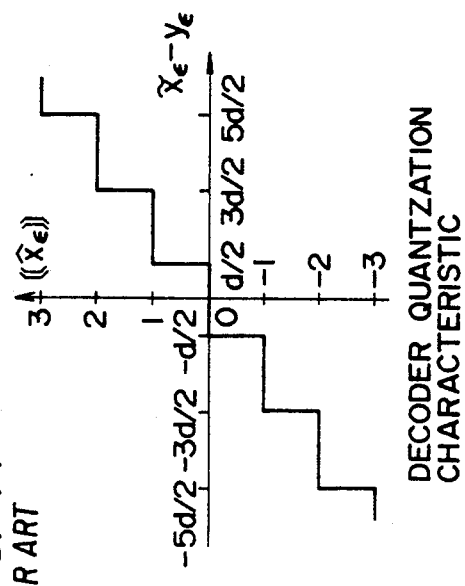
FIG. 11 is a quantizing characteristic in a decoder used in the prior art MPCM system.

FIG. 6 shows, in a block diagram form, a decoding system in the third embodiment of the present invention, which functions to perform inverse transformation opposite to the coding system of FIG. 5.

The decoding system of FIG. 6 includes an input terminal 601 for input of the conversion information (inverse conversion coefficient 1/a), an input terminal 602 for input of the leading data $d_1$ in a block of the conversion input signal, an input terminal 603 for input of the maximum sx of predictive errors for the conversion input data, a decoder unit 605 for the conversion input signal transmitted from the coder system, an inverse conversion circuit 606 for performing inverse conversion of a decoded conversion input signal into the original input signal, a block resolver 212 for resolving a block into reproduced block input signals and for converting the block input signals for blocks into a signal (reproduced input signal) having the same data array as the original input signal, and an output terminal 607 for output of the reproduced input signal. In the decoder unit 605, the same parts as those in FIG. 3 are denoted by the same reference numerals. The decoder unit 605 has a modulo decoder 205, an adder 206, a subtracter 207, an offset reproducer 208, an adder 209, and a switch 210. The inverse converter 606 has a multiplier 608.

The operation of the decoding system arranged as mentioned above will be explained.

The decoder unit 605 has basically the same arrangement as the decoder unit of FIG. 3, except that the divisor data OU is not input because the data OU is constant and it is unnecessary to transmit the data OU, so that the decoder unit 605 decodes the encoded data into the original conversion input signal with use of the transmitted additional codes. The conversion input signal is multiplied at the inverse conversion circuit 606 multiplied by the transmitted inverse conversion coefficient 1/a (conversion information) to form the original block input signal. The block input signal is then sent to the block resolver 212 to be converted to a signal having the same data array as the original input signal of the coder system. Then the output of the block resolver 212 is output from the terminal 607.

As has been explained above, with the third embodiment comprising the coder and decoder systems shown in FIGS. 5 and 6, the input signal is multiplied by the conversion coefficient a to obtain the conversion input signal and the conversion input signal is subjected to the information preserving coding of the first embodiment of FIG. 1. Since the predictive error dynamic range of the input signal is proportional to the predictive error dynamic range of the conversion input signal when the influences of the rounding error is ignored, the predictive error dynamic range of the input signal is first computed and the conversion coefficient a is set so that the predictive error dynamic range of the conversion input signal does not exceed the dynamic range determined by the word length of the encoded data and also close thereto, which results in that coding can be efficiently realized. Further, since the conversion coefficient is set, taking the rounding error into consideration, so as no to exceed the upper limit of the dynamic range, the conversion input signal can be subjected to the information preserving coding and no anomaly errors will take place. The distortion of the input signal through the coding and decoding operation is caused only by the word length limitation and rounding error by the conversion coefficient multiplication in conversion of the input signal to the conversion input signal and in its inverse conversion.

Although the word lengths of the encoded codes in each block have been set to be all constant in the foregoing embodiments, an average word length of the encoded codes may be set constant for every predetermined-number blocks. Consider, for example, that coding is carried out with an average word length of 4 bits for every 2 blocks. When two blocks A and B have 6 and 4 bits respectively and allow information preserving coding, coding can be realized without any deterioration because of 4 bits of average encoding word length. When the word lengths of the encoded codes for each block are all fixed to be 4 bits, the block A produces signal deterioration corresponding to 2 bits and a space corresponding to 2 bits/sample is produced in the block. Accordingly, when the transmission rate is set to be constant and coding is carried out for ever plural blocks, coding efficiency can be improved when compared with that of coding for every block.

In this coding method, the following is an example of how to determine the number of bits with which each block in the encoding unit is encoded. The predictive error dynamic range is computed for all the blocks in the encoding unit to find the average bit number of the encoded codes in the information preserving coding operation. Conversion is carried out so that the predictive error dynamic range of the input signal for each block is small in average by a bit number corresponding to a difference between the found bit number and the actual bit number.

The abovementioned coding system can be realized only by adding to the coding system of FIG. 5 a means for computing an average encoding bit number when it is assumed to perform information preserving coding with respect to a buffer memory corresponding to the illustrated encoding unit, and a means for computing a difference between the computed average encoding bit number and the actual encoding bit number and storing the difference. This decoder system is basically the same as the decoder system of FIG. 6 and thus explanation thereof is omitted.

Even in the foregoing embodiments, the encoded data dynamic range is not fully efficiently utilized, because some allowance is provided so that, even when the predictive error dynamic range is expanded by the rounding error, this causes the predictive error dynamic range not to exceed the encoded data dynamic range. There is considered a method which corresponds to a combination of the second and third embodiments. That is, although a plurality of conversion coefficients and a plurality of coder units corresponding in number to the conversion coefficients are provided in the third embodiment to select one of the conversion coefficients which efficiently utilizes the encoded data dynamic range, this can be easily realized with a combination of the second and third embodiments and thus explanation thereof is omitted.

Figure 8:
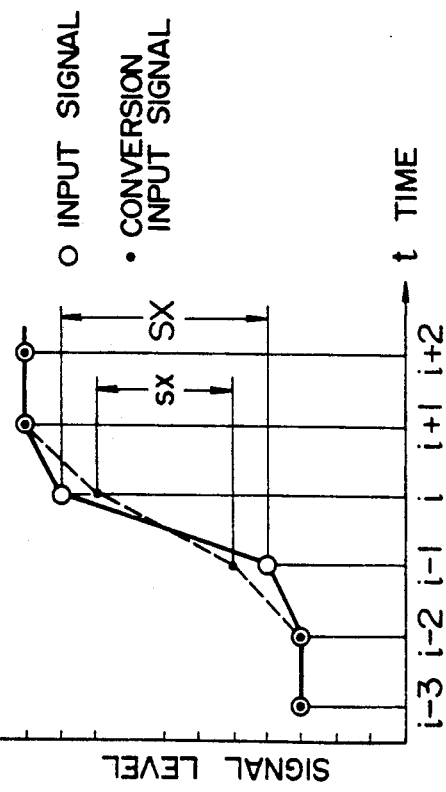
FIG. 8 is a graph for explaining how to make small the dynamic range of a predictive error.
Figure 9:
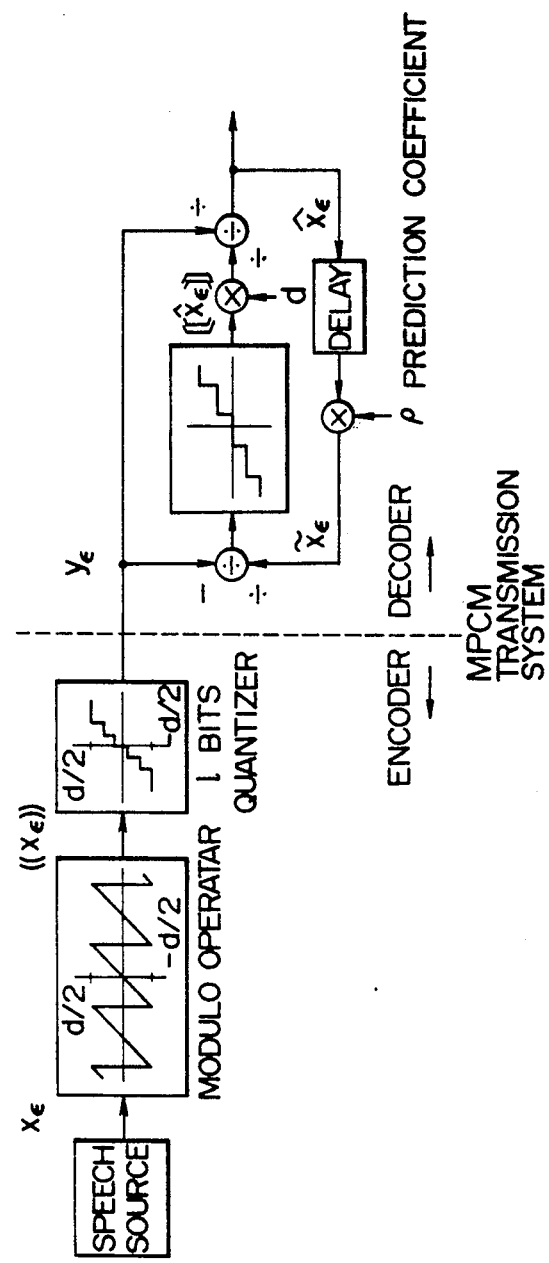
FIG. 9 is a block diagram showing an arrangement of the related art encoding/decoding MPCM system.

As a method of reducing the predictive error dynamic range, there is considered such a method that non-linear conversion is carried out as shown in FIG. 8. In the drawing, white and black dots EP denote input signals before and after its conversion respectively. The drawing shows an example in which the maximum SX ($=D_i-D_{i-1}$) of predictive errors between input data $D_{i-1}$ and $D_i$ at times $(i-1)$ and $i$ occurs and a conversion input signal has $+1$ and $-1$ corresponding to the input data $D_{i-1}$ and $D_i$ associated with the generation of the maximum SX. Thus, the maximum sx of predictive errors for the conversion input signal is 2-levels smaller than the maximum SX. In this way, by making slightly small or large some or all of input data associated with the generation of the maximum or minimum predictive error, the maximum and minimum predictive errors of the generated conversion input signal can be made slightly small, that is, non-linear processing of making small the predictive error dynamic range can be realized. Since the level change amount of the input data is suppressed to be small, the need for inverse conversion at the time of decoding can be eliminated. This nonlinear conversion is valid when the predictive error dynamic range of the input signal is equal to or slightly larger than 2 to the power of N, or when it is desired to suppress an increase in the predictive error caused by the rounding error at the time of obtaining the conversion signal by multiplying the input signal by the conversion coefficient. This is because the setting of the predictive error dynamic range to be smaller than and close to 2 to the power of N means the efficient use of the encoded code dynamic range, i.e., the capability of reduction of the encoded code word length by 1 bit.

The following is another example of reducing the predictive error dynamic range.

That is, since the predictor in the coding system is a sort of low pass filter, the predictive errors can be regarded as the high frequency components of the input signal. Thus, a high frequency suppressing filter can be considered to reduce the predictive error dynamic range. For its decoding, a filter having a characteristic opposite to the high frequency suppressing filter is used. In this case, as the conversion information, codes indicative of the presence or absence of the filter or the characteristic thereof can be considered.

The block may have a one-dimensional configuration (for example, 16 picture elements in horizontal direction and one line in vertical direction), a two-dimensional configuration (for example, 4 picture elements in horizontal direction and 4 lines in vertical direction), or a three-dimensional configuration extended between fields and frames. As another modification method, there can also be considered a method that coding is carried out within a field or a frame and a block is extended and encoded in a time-axis direction expressed in field or frame units.

Generally speaking, a block consists of input data corresponding to sample positions continuous in horizontal or vertical direction, but the present invention is not limited to the particular configuration so long as a block consists of a plurality of strongly correlative input data. For example, in the case of an NTSC signal or the like, a block can also consist of input data corresponding to the sample positions of equiphase points.

Although previous-value prediction has been carried out in the predicting method in all the foregoing embodiments, the present invention is not restricted to the particular method and may employ various other suitable prediction method.

In the case where a block has a one-dimensional configuration, it is simplest to extract input data in a block in the input order and to use a data previous by one as one of an input data or decode data combination to be used in prediction. In the case where a block has a one- or more-dimensional configuration, the order of input data to be extracted and the combination of data t be used in prediction may be considered in various ways. FIG. 7 shows an example when a block is made up of 4 picture elements in horizontal direction and 4 lines in vertical direction. In the drawing, mark 0 represents a picture element, a number represents the order i of data to be extracted, and an arrowed solid-line means that a data from which the arrow line is directed, is used in predicting a data, into which the arrow line is directed. The smaller divisor data provides the higher coding efficiency but the efficiency varies depending on the correlation of the input data. Thus, there may be considered such a method as to use a plurality of coding methods and to output the output of more efficient one of the coding methods together with an additional code indicative of its predicting method attached to the system output.

In the previous-value prediction, a signal providing a highest coding efficiency is such a signal that monotonously increases or decreases, because the predictive error dynamic range is smallest. Accordingly, there can be considered such a method that a plurality of different orders of input data to be extracted from the block are prepared and one of the orders which provides a smallest predictive error dynamic rang is selected. In this case, a code indicative of the input-data extracting method (a sort of predicting method) is transmitted as one of the additional codes.

Though the above prediction method has been an extrapolation prediction, an interpolation prediction may also be employed. For example, in the first embodiment, in which only the leading input data in each block is not encoded and transmitted as it is, so that a value obtained through linear interpolation with use of the leading data of each block is used as a predicted value and a difference between input data is used as a predictive error. In the interpolation prediction, unlike the extrapolation prediction, a sequentially decoded data is not used in prediction of the next data and thus no erroneous transmission takes place.

In the case where high frequency components in an input signal are very large, there is valid a prediction method that one (for example, the leading data in the block) of input data of the input signal in a block at its specific position or an average value of all the data in the block is used as a prediction data for all the input data of the block. When the input signal has input data of 20, 30, 20, 30, ... repeated in this order, for example, the maximum SX and minimum SN of predictive errors in the previous-value prediction become 10 and −10 respectively and the dynamic range SDR is 20. Meanwhile, when the leading data 20 is used as a predicted value for all the input data of the same block, the maximum SX and minimum SN of the predictive errors becomes 10 and 0 respectively and the dynamic range SDR is 10 that is small.

As has been explained in the foregoing, in accordance with the present invention, there can be provided an efficient coding method and its decoding method which enable efficient transmission without any anomaly errors with use of a simple arrangement, finding its practically useful applications.

What is claimed is:

1. A method of encoding data, comprising the steps of:
   (a) punctuating an input signal to be encoded into s blocks, each block having m input data $D_{i,j}$, where $i=1, 2, \ldots, s$, and $j=1, 2, \ldots, m$, s and m are integers not less than one, and i consecutively increases from 1 to s;
   (b) predicting the input data $D_{i,j}$ to obtain estimates $P_{i,j}$ thereof for consecutively increasing j in each block i, by use of at least one of a partial set of the input data $D_{i,1}, D_{i,2}, \ldots, D_{i,j}$—of the block, and additional codes of the block;
   (c) evaluating predictive errors $S_{i,j}$ which are the difference between the input data $D_{i,j}$ and estimates $P_{i,j}$ thereof for respective values of j specified in step (b) in each block i;
   (d) determining a maximum value $SX_i$ of the predictive errors $S_{i,j}$ and a minimum value $SN_i$ of the predictive errors $S_{i,j}$ for each block i;
   (e) finding a divisor data $OU_i$ which is larger than the difference between the maximum and minimum values $(SX_i - SN_i)$ of the predictive errors for each block i;
   (f) dividing the input data $D_{i,j}$ for respective values of j by the divisor data $OU_i$ to find remainders $E_{i,j}$ in each block i;
   (g) encoding the remainders $E_{i,j}$ for respective values of j in each block i; and
   (h) outputting the additional codes respectively representing the maximum value $SX_i$, the minimum value $SN_i$ and the divisor data $OU_i$ of each block i.

2. A method of encoding data according to claim 1, wherein data used in step (b) are the partial set of the input data $D_{i,1}, D_{i,2}, \ldots, D_{i,j}$—of the block i, and a complete set of input data of another block $D_{r,j}$ ($r<1$, $j=1, 2, \ldots, m$) to which step (b) has already been applied.

3. A method of encoding data according to claim 1, wherein step (b) puts the input data $D_{i,1}$ as the estimates $P_{i,j}$, and step (h) outputs the input data $D_{i,1}$ as a part of the additional codes.

4. A method of encoding data according to claim 1, wherein step (b) comprises a step of averaging all the input data $D_{i,j}$ in the block i, putting the average as the estimates $P_{i,j}$ for respective values of j, and step (h) outputs the average as one of the additional codes.

5. A method of encoding data according to claim 1, wherein step (b) obtains the estimates $P_{i,j}$ for the block i by interpolation by use of the additional codes of block r situated adjacent to the block i.

6. A method of encoding data according to claim 1, wherein step (b) performs prediction by use of a plurality of prediction methods, step (e) obtains the divisor data $OU_i$ by a prediction method which minimizes the divisor data $OU_i$, and step (h) outputs information showing that the employed prediction method minimizes the divisor data $OU_i$ as one of the additional codes.

7. A method of encoding data according to claim 1, wherein step (e) employs $2^M$ as each of the divisor data $OU_i$, which satisfies the following inequality:

$$2^M > (SX_i - SN_i) \geq 2^{M-1}.$$

8. A method of encoding data, comprising the step of:
   (a) punctuating an input signal to be encoded into s blocks, each block having m input data $D_{i,j}$ ($i=1, 2, \ldots, s, j=1, 2, \ldots, m$) where s and m are integers not less than one, and i consecutively increases from 1 to s;
   (b) converting the input data $D_{i,j}$ to be encoded by a predetermined conversion method of obtaining converted data $d_{i,j}$ for respective values of $j$ in each block;

(c) predicting the converted data $d_{i,j}$ to be encoded to obtain estimates $p_{i,j}$ thereof for consecutively increasing $j$ in each block $i$, by use of at least one of a partial set of the converted data $d_{i,1}$, $d_{i,2}$, ..., $d_{i,j-1}$ of the block, and a set of additional codes of the block;

(d) evaluating predictive errors $s_{i,j}$ which are the differences between the converted data $d_{i,j}$ and the estimates $p_{i,j}$ thereof for respective values of $j$ specified in step (c) in each block $i$;

(e) determining a maximum value $sx_i$ of the predictive errors $s_{i,j}$ and a minimum value $sn_i$ of the same for each block $i$;

(f) finding a divisor data $ou_i$ which is larger than the difference between the maximum and minimum values ($sx_i - sn_i$) of the predictive errors for each block $i$;

(g) dividing the converted data $d_{i,j}$ for respective values of $j$ by the divisor data $ou_i$ to find remainders $e_{i,j}$ in each block $i$;

(h) encoding the remainders $e_{i,j}$ for respective values of $j$ in each block $i$; and (i) outputting the additional codes respectively representing the maximum value $sx_i$, the minimum value $sn_i$, the divisor data $ou_i$ and a conversion information showing the conversion method used in the step (b), of each block $i$.

9. A method of encoding data according to claim 8, wherein step (b) comprises a step of multiplying the input data $D_{i,j}$ by a coefficient predetermined for each block $i$.

10. A method of encoding data according to claim 8, wherein step (b) comprises either one of the steps of increasing and decreasing a part of the input data $D_{i,j}$ by a small amount.

11. A method of encoding data according to claim 8, wherein step (b) comprises suppressing high frequency components of the input data $D_{i,j}$.

12. A method of encoding and decoding data, comprising:

(a) punctuating an input signal to be encoded into s blocks, each block having m input data $D_{i,j}$, where $i=1, 2, \ldots, s$, and $j=1, 2, \ldots, m$, s and m are integers not less than one, and $i$ consecutively increases from 1 to s;

(b) predicting the input data $D_{i,j}$ to obtain estimates $P_{i,j}$ thereof for consecutively increasing $j$ in each block $i$, by use of at least one of a partial set of the input data $D_{i,1}, D_{i,2}, \ldots, D_{i,j-1}$ of the block, and additional codes of the block;

(c) evaluating predictive errors $S_{i,j}$ which are the difference between the input data $D_{i,j}$ and estimates $P_{i,j}$ thereof for respective values of $j$ specified in step (b) in each block $i$;

(d) determining a maximum value $SX_i$ of the predictive errors $S_{i,j}$ and a minimum value $SN_i$ of the predictive errors $S_{i,j}$ for each block $i$;

(e) finding a divisor data $OU_i$ which is larger than the difference between the maximum and minimum values ($SX_i - SN_i$) of the predictive errors for each block $i$;

(f) dividing the input data $D_{i,j}$ for respective values of $j$ by the divisor data $OU_i$ to find remainders $E_{i,j}$ in each block $i$;

(g) encoding the remainders $E_{i,j}$ for respective values of $j$ in each block $i$;

(h) outputting the additional codes respectively representing the maximum value $SX_i$, the minimum value $SN_i$ and the divisor data $OU_i$ of each block $i$; and (i) decoding said encoded remainders $E_{i,j}$ and said additional codes by the following steps:

(j) increasing $i$ consecutively from 1 to s;

(k) finding a divisor $OU_i$ for each block $i$ by use of the additional codes of the block;

(l) recovering remainders $E_{i,j}$ for respective values of $j$ in each block $i$ by decoding the additional codes representing remainder $E_{i,j}$ of the block;

(m) predicting data $D_{i,j}$ to obtain estimates $P_{i,j}$ thereof for consecutively increasing $j$ in each block $i$, by use of at least one of a partial set of data $D_{i,1}, D_{i,2} \ldots, D_{i,j-1}$ of the block which have already been decoded, and a set of the additional codes of the block;

(n) finding offsets $F_{i,j}$ for respective values of $j$ specified in step (m) in each block $i$, by use of the additional codes, the recovered remainders $E_{i,j}$ and the estimates $P_{i,j}$ of the block, wherein the offsets $F_{i,j}$ are $N_j$ times the divisor $OU_i$, where $N_j$ are uniquely determinable integers;

(o) adding the offsets $F_{i,j}$ and the recovered remainders $E_{i,j}$ to obtain decoded data $D_{i,j}$ for respective values of $j$ specified in the step (m) in each block $i$; and (p) deblocking the blocks to which steps (j) to (o) have been applied.

13. A method according to claim 12, wherein the step (l) comprises a step of detecting a transmission error of the encoded remainder $E_{i,j}$, and upon detecting the error, step (m) is performed in a different order of prediction from that in step (d) of predicting $D_{i,j}$, by use of decoded data in neighboring blocks which have already been decoded, along with decoded data in the block to be decoded.

14. A method according to claim 12, wherein a step of detecting a transmission error in the additional code is provided in either one of steps (k) and (n), and upon detecting the error, the steps (k) and (n) are performed by use of additional codes of blocks which are situated adjacent to the block to be decoded and have already been decoded.

15. A method according to claim 13, further comprising a step of evaluating a predictive error $S_{r,k}$ which is the difference between $P_{r,k}$ and $D_{r,k}$ in a block $r$ which has already been decoded and is situated adjacent to the block $i$ to be decoded, and wherein, step (m) obtains estimates $P_{i,j}$ of the data $D_{i,j}$ for the block $i$, but use of data $D_{i,1}, D_{i,2}, \ldots D_{i,j-1}$ which have already been decoded, step (m) also obtains estimates $P_{r,k}$ of data $D_{r,k}$ for the block $r$, and the step of detecting a transmission error comprises the steps of determining a range Z within which the predictive error $S_{i,j}$ will fall, by use of the additional codes, and detecting the predictive error $S_{r,k}$ falling out of the range Z.

16. A method of encoding and decoding data, comprising (a) punctuating an input signal to be encoded into s blocks, each block having m input data $D_{i,j}$ ($i=1, 2, \ldots, s, j=1, 2, \ldots, m$) where s and m are integers not less than one, and $i$ consecutively increases from 1 to s;

(b) converting the input data Di,j to be encoded by a predetermined conversion method of obtaining converted data di,j for respective values of j in each block;

(c) predicting the converted data di,j to be encoded to obtain estimates pi,j thereof for consecutively increasing j in each block i, by use of at least one of a partial set of the converted data di,1, di,2, ..., di,j−1 of the block, and a set of additional codes of the block;

(d) evaluating predictive errors si,j which are the differences between the converted data di,j and the estimates pi,j thereof for respective values of j specified in step (c) in each block i;

(e) determining a maximum value sxi of the predictive errors si,j and a minimum value sni of the same for each block i;

(f) finding a divisor data oui which is larger than the difference between the maximum and minimum values (sxi−sni) of the predictive errors for each block i;

(g) dividing the converted data di,j for respective values of j by the divisor data oui to find remainders ei,j in each block i;

(h) encoding the remainders ei,j for respective values of j in each block i;

(i) outputting the additional codes respectively representing the maximum value sxi, the minimum value sni, the divisor data oui and a conversion information showing the conversion method used in the step (b), of each block i; and (j) decoding said encoded remainders Ei,j and the additional codes by the following steps:

(k) increasing i consecutively from 1 to s;

(l) finding a divisor oui for each block i by use of the additional codes of the block;

(m) recovering remainders ei,j for respective values of j in each block i by decoding the additional codes representing remainders ei,j of the block;

(n) predicting data di,j to obtain estimates pi,j thereof for consecutively increasing j in each block i, by use of at least one of a set of data di,1, di,2, ..., di,j−1 which have already been decoded, and the additional codes of the block;

(o) finding an offset fi,j for respective values of j specified in step (n) in each block i, by use of the additional codes, the recovered remainders ei,j and the estimates pi,j of the block, wherein the offsets fi,j are nj times the divisor oui, where nj are uniquely determinable integers;

(p) adding the offsets fi,j and the recovered remainders ei,j to obtain decoded data di,j for respective values of j specified in step (n) in each block i;

(q) re-converting the decoded data di,j to obtain data Di,j for respective values of j in each block i, by way of a reversal operation of converting step (b) according to conversion information given in one of the additional codes; and (r) deblocking the blocks to which the steps (k) to (q) have been applied.

17. A method according to claim 16, wherein the step (m) comprises a step of detecting a transmission error of the encoded remainder ei,j, and upon detecting the error, the step (n) is performed in a different order of prediction from that in predicting di,j in step (c) by use of decoded data in neighboring blocks which have already been decoded, along with decoded data in the block to be decoded.

18. A method of decoding according to claim 16, wherein a step of detecting a transmission error of the additional code is provided in either one of steps (l) and (o), and upon detecting the error, the steps (l) and (o) are performed by use of additional codes of blocks which are situated adjacent to the block to be decoded and have been already decoded.

19. A method according to claim 17, further comprising a step of evaluating a predictive error Sr,k which is the difference between Pr,k and Dr,k in a block r which has already been decoded and is situated adjacent to the block i to be decoded, and wherein, step (m) obtains estimates pi,j of the data di,j for the block i, by use of data di,1, di,2, ..., di,j−1 which have already been decoded, step (m) also obtains estimates pr,k of data dr,k for the block r, and the step of detecting a transmission error comprises steps of determining a range Z within which the predictive error si,j will fall, by use of the additional codes, and detecting the predictive error sr,k falling out of the range Z.

* * * * *